United States Patent
Kim et al.

(10) Patent No.: US 12,362,269 B2
(45) Date of Patent: Jul. 15, 2025

(54) INTEGRATED CIRCUIT (IC) PACKAGES EMPLOYING SUPPLEMENTAL METAL LAYER COUPLED TO EMBEDDED METAL TRACES IN A DIE-SIDE EMBEDDED TRACE SUBSTRATE (ETS) LAYER, AND RELATED FABRICATION METHODS

(71) Applicant: QUALCOMM Incorporated, San Diego, CA (US)

(72) Inventors: Michelle Yejin Kim, San Diego, CA (US); Kuiwon Kang, San Diego, CA (US); Joan Rey Villarba Buot, Escondido, CA (US); Ching-Liou Huang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 655 days.

(21) Appl. No.: 17/451,302

(22) Filed: Oct. 18, 2021

(65) Prior Publication Data
US 2023/0118028 A1    Apr. 20, 2023

(51) Int. Cl.
*H01L 23/498*    (2006.01)
*H01L 21/48*     (2006.01)
*H01L 23/00*     (2006.01)

(52) U.S. Cl.
CPC .... *H01L 23/49822* (2013.01); *H01L 21/4857* (2013.01); *H01L 23/49838* (2013.01); *H01L 24/16* (2013.01); *H01L 2224/16225* (2013.01)

(58) Field of Classification Search
CPC ......... H01L 23/49822; H01L 23/49838; H01L 24/16; H01L 21/4857
See application file for complete search history.

(56) References Cited

U.S. PATENT DOCUMENTS 8,772,951 B1    7/2014  Kim et al.
10,418,316 B1 * 9/2019  Lu ........................ H01L 23/3128
(Continued)

OTHER PUBLICATIONS

Invitation to Pay Additional Fees and Partial International Search for International Patent Application No. PCT/US2022/076910, mailed Dec. 14, 2022, 12 pages.
(Continued)

*Primary Examiner* — Michael Jung
(74) *Attorney, Agent, or Firm* — Withrow & Terranova, PLLC

(57) ABSTRACT

Integrated circuit (IC) packages employing a supplemental metal layer coupled to embedded metal traces in a die-side embedded trace substrate (ETS) layer to reduce metal density mismatch, and related fabrication methods. An IC package includes a semiconductor die ("die") electrically coupled to a package substrate. The package substrate includes a die-side ETS metallization layer adjacent to and coupled to the die. To reduce or avoid metal density mismatch between the die-side ETS metallization layer and another metallization layer(s) in the package substrate, a supplemental metal layer with additional metal interconnects is disposed adjacent to the die-side ETS metallization layer. The additional metal interconnects are coupled in a vertical direction to the embedded metal traces in the die-side ETS metallization layer to increase metal density of die-side metal interconnects formed by the additional metal interconnects coupled to the embedded metal traces in the die-side ETS metallization layer.

37 Claims, 16 Drawing Sheets

(56) References Cited

U.S. PATENT DOCUMENTS

| | | | |
|---|---|---|---|
| 2015/0062848 A1 | 3/2015 | Lee et al. | |
| 2018/0145017 A1 | 5/2018 | Tsai et al. | |
| 2018/0240743 A1 | 8/2018 | Lee et al. | |
| 2018/0350630 A1 | 12/2018 | Kang et al. | |
| 2019/0035753 A1* | 1/2019 | Shih | H01L 24/11 |
| 2019/0252305 A1* | 8/2019 | Peng | H01L 23/49827 |
| 2020/0013706 A1 | 1/2020 | Kang et al. | |
| 2020/0051907 A1* | 2/2020 | Kang | H01L 24/17 |
| 2020/0335443 A1* | 10/2020 | Sun Zhou | H01L 21/4857 |
| 2020/0411432 A1 | 12/2020 | Kanabe et al. | |
| 2021/0057352 A1 | 2/2021 | Agarwal et al. | |
| 2021/0098352 A1* | 4/2021 | Sir | H01L 23/49827 |
| 2022/0068780 A1 | 3/2022 | Kang et al. | |
| 2023/0086094 A1 | 3/2023 | Patil et al. | |
| 2023/0163112 A1 | 5/2023 | We et al. | |
| 2023/0215849 A1 | 7/2023 | Choi et al. | |
| 2023/0217593 A1* | 7/2023 | Nam | H05K 1/115 361/761 |
| 2025/0062235 A1 | 2/2025 | Buot et al. | |

OTHER PUBLICATIONS

International Search Report and Written Opinion for International Patent Application No. PCT/US2022/076910, mailed Feb. 6, 2023, 19 pages.
U.S. Appl. No. 17/482,718, filed Sep. 23, 2021.

* cited by examiner

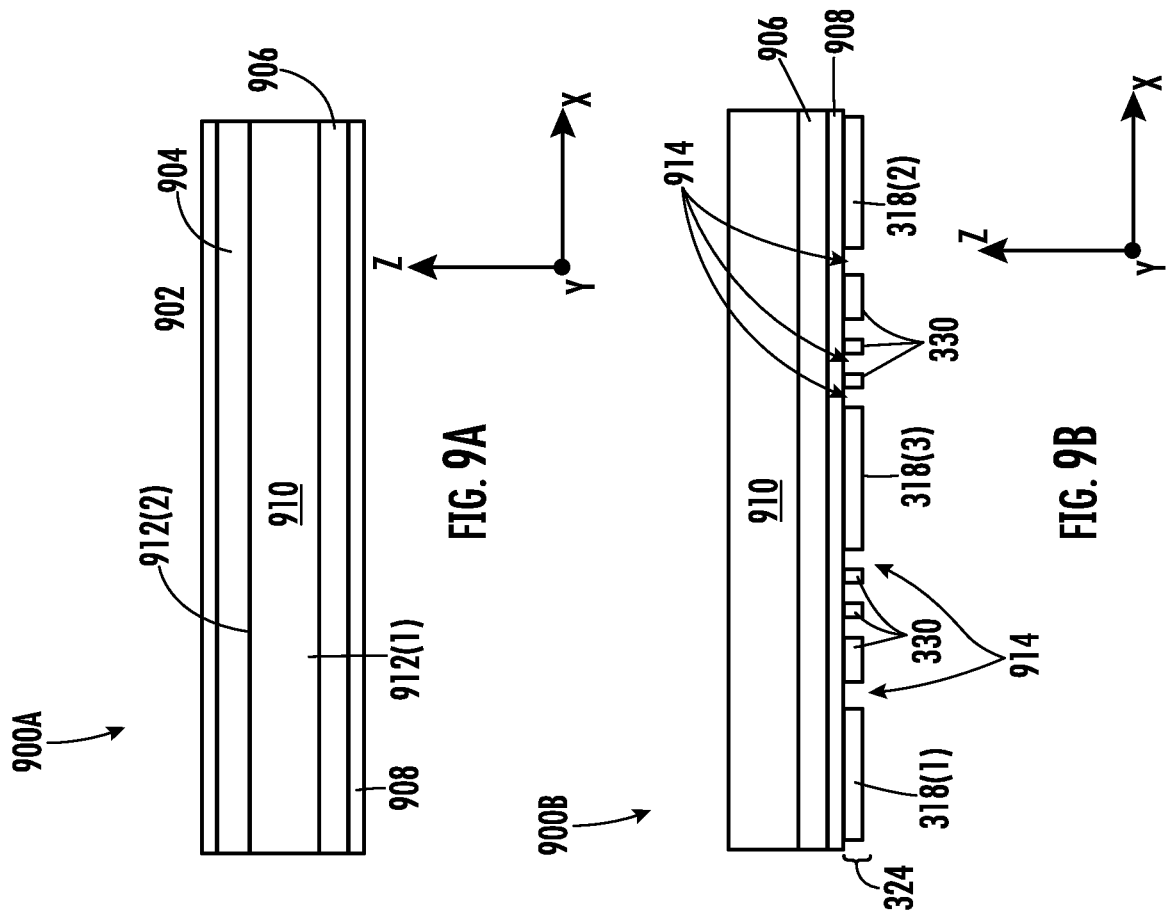
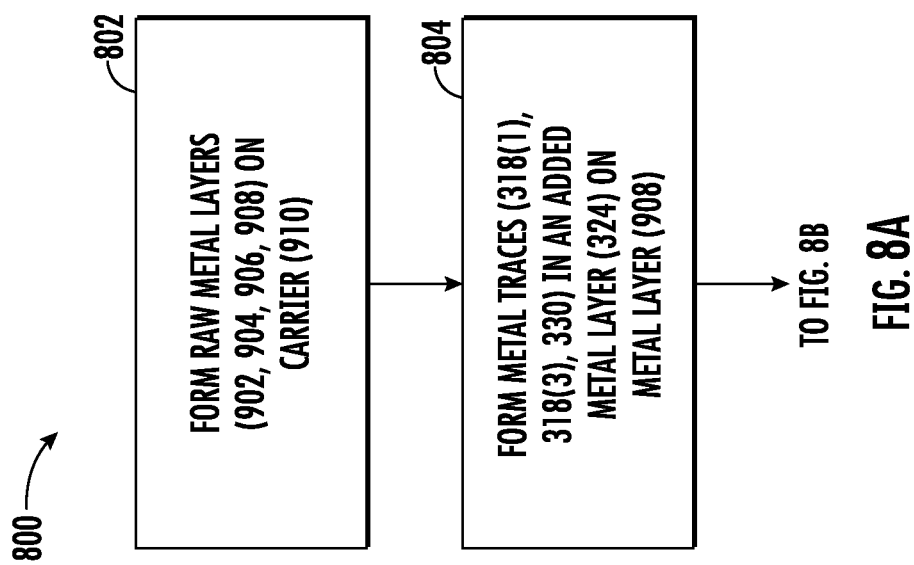

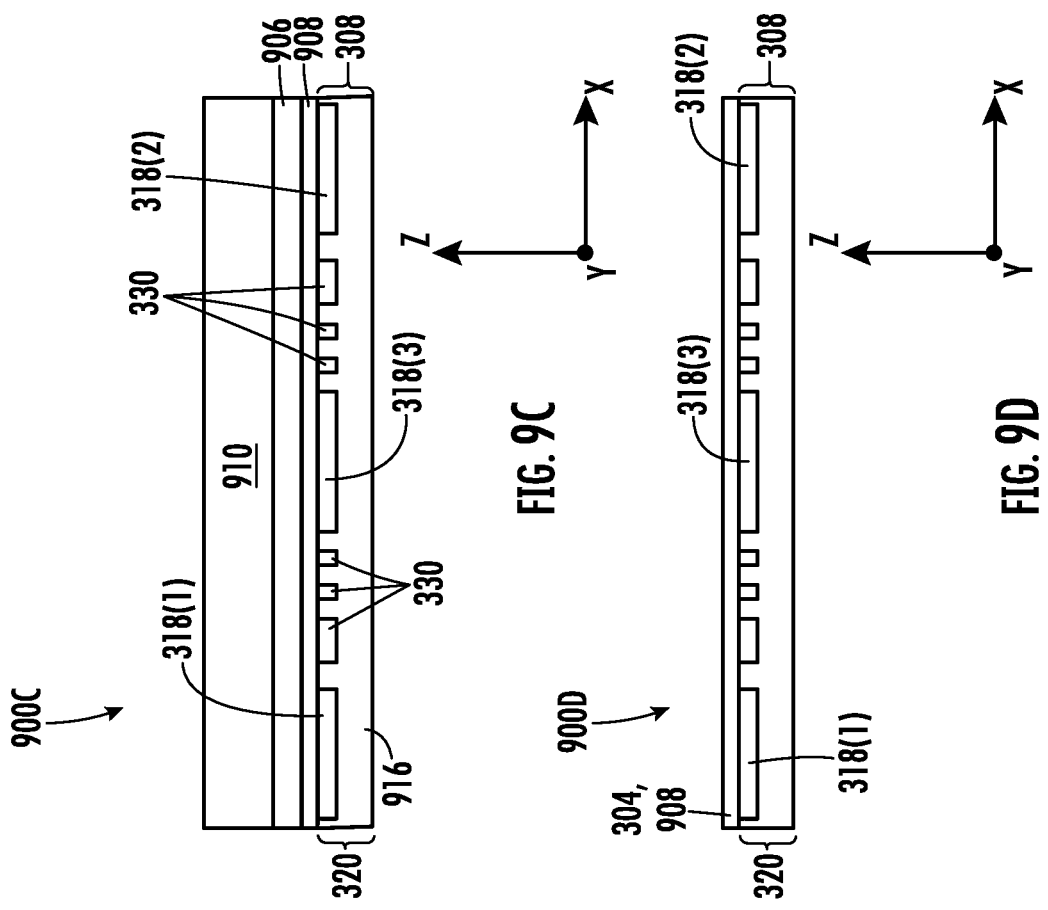
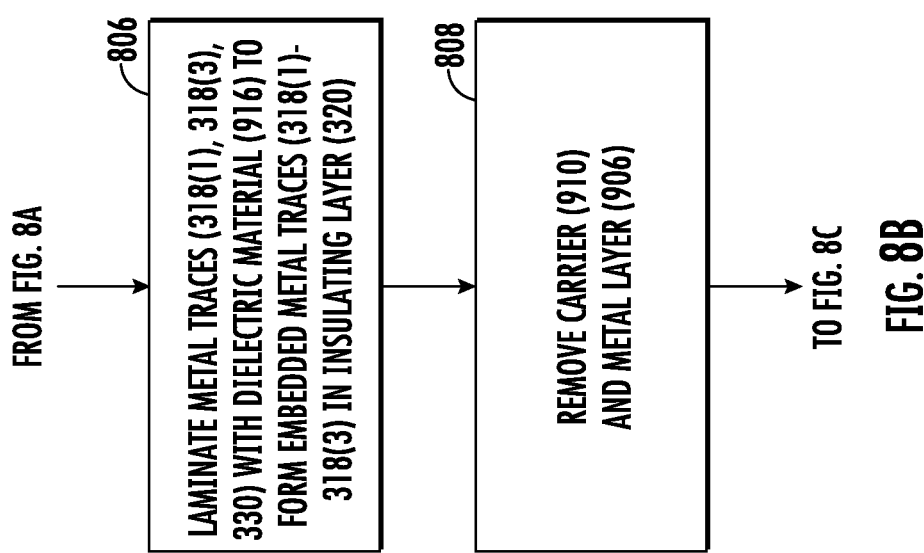

INTEGRATED CIRCUIT (IC) PACKAGES EMPLOYING SUPPLEMENTAL METAL LAYER COUPLED TO EMBEDDED METAL TRACES IN A DIE-SIDE EMBEDDED TRACE SUBSTRATE (ETS) LAYER, AND RELATED FABRICATION METHODS

BACKGROUND

I. Field of the Disclosure

The field of the disclosure relates to integrated circuit (IC) packages, and more particularly to design and manufacture of package substrates that support signal routing to a semiconductor die(s) in the IC package.

II. Background

Integrated circuits (ICs) are the cornerstone of electronic devices. ICs are packaged in an IC package, also called a "semiconductor package" or "chip package." The IC package includes one or more semiconductor dice ("dies" or "dice") as an IC(s) that are mounted on and electrically coupled to a package substrate to provide physical support and an electrical interface to the die(s). The package substrate includes one or more metallization layers that include metal interconnects (e.g., metal traces, metal lines) with vertical interconnect accesses (vias) coupling the metal interconnects together between adjacent metallization layers to provide electrical interfaces between the die(s). The die(s) is electrically interfaced to metal interconnects exposed in a top, die-side metallization layer of the package substrate to electrically couple the die(s) to the metal interconnects of the package substrate. The package substrate also includes a bottom, outer metallization layer that includes metal interconnects coupled to external metal interconnects (e.g., ball grid array (BGA) interconnects) to provide an external interface between the die(s) in the IC package. The external metal interconnects can also be coupled (e.g., soldered) to traces in a printed circuit board (PCB) to attach the package to the PCB and interface its die(s) with the circuitry of the PCB.

As an example, the package substrate of an IC package may be an embedded-trace substrate (ETS)-based package substrate. An ETS-based package substrate includes one or more metallization layers that are ETS metallization layers having embedded metal traces as metal interconnects. The embedded metal traces are embedded in an insulating layer (i.e., dielectric layer) that is part of an ETS metallization layer. An ETS metallization layer facilitates providing higher density bump/solder joints with reduced line/spacing ratio (L/S) for electrically coupling a die to the package substrate for signal routing. Metal embedded traces are formed in the ETS metallization layer that are electrically coupled to the die and metal interconnects in other metallization layers of the package substrate to provide signal routing paths for signal routing. For example, if the package substrate is a two layer (2L) ETS-based package substrate, the package substrate could include an upper, die side ETS metallization layer with embedded metal traces coupled to die interconnects of a die, and a bottom, external interconnect side ETS metallization layer with embedded metal traces coupled to external interconnects to provide the external interface to the IC package.

The routing and interconnect design of the IC package dictates the number of embedded metal traces provided in a die-side ETS metallization layer of a package substrate. This affects the area of metal traces provided in the die-side ETS metallization layer in a horizontal direction (i.e., the X- and Y-axes directions). This can cause a metal (e.g., copper) area mismatch, and thus metal density mismatch, between embedded metal traces in the die side ETS metallization layer and metal traces in other metallization layers in the package substrate. For example, the metal density of the embedded metal traces in the die-side ETS metallization layer may be ten percent (10%) less than the metal density of the metal traces in another metallization layer(s) in the package substrate. One reason that a metal density mismatch can occur is due to the metal in die-side ETS metallization layer being dominated by metal traces, as opposed to pad and/or a ground plane for example. This asymmetric metal density between the die-side ETS metallization layer and other metallization layers in the package substrate causes a coefficient of thermal expansion (CTE) mismatch in the package substrate. This CTE mismatch can cause warpage in response to different expansion and contraction in the horizontal direction (X and Y-axis directions) between the die-side ETS metallization layer and another metallization layer(s) in the package substrate.

SUMMARY OF THE DISCLOSURE

Aspects disclosed herein include an integrated circuit (IC) package employing a supplemental metal layer coupled to embedded metal traces in a die-side embedded trace substrate (ETS) layer to reduce metal density mismatch. Related fabrication methods are also disclosed. An IC package is provided that includes a semiconductor die ("die") electrically coupled to a package substrate. The package substrate includes a die-side ETS metallization layer adjacent to and coupled to die interconnects (e.g., raised interconnect bumps) of the die to provide an electrical coupling between the die and the package substrate. The die-side ETS metallization layer facilitates providing higher density bump/solder joints with reduced line/spacing ratio (L/S) for providing a higher density electrical interface to the die for higher density signal routing. The embedded metal traces in the die-side ETS metallization layer may be of less area than the area of metal interconnects in other metallization layers in the package substrate due to the metal in the die-side ETS metallization layer being dominated by metal traces, as opposed to for example, metal pads or ground planes. This difference in metal area causes a metal density mismatch between the die-side ETS metallization layer and other metallization layers that causes a mismatch in their coefficient of thermal expansions (CTEs). This mismatch in CTE between the die-side ETS metallization layer and other metallization layers in the package substrate can contribute to increased warpage of the package substrate. Thus, in exemplary aspects, to reduce or avoid this metal density mismatch, a supplemental (i.e., additional) metal layer with additional metal interconnects formed therein, is disposed adjacent to the die-side ETS metallization layer. The additional metal interconnects are coupled in a vertical direction to the embedded metal traces in the die-side ETS metallization layer to form die-side metal interconnects of increased thickness/density in the package substrate. This can reduce or avoid the need to reduce the thickness of metal layers in another metallization layer(s) in the package substrate to reduce the metal density mismatch between the die-side ETS metallization layer and the other metallization layer(s) in the package substrate. For example, reducing the thickness of a metal layer in an external metallization layer of a package substrate supporting external interconnects can 29 lead to increased dimple depth in the metal interconnects therein, that then increases the risk of voids in solder joints coupling the metal interconnects to the external interconnects.

As an example, the additional metal interconnects can be provided in a supplemental metal layer (e.g., an additional copper layer) that is formed adjacent to an outer surface of the die-side ETS metallization layer in fabrication of the IC package. The additional metal interconnects can be coupled to respective exposed outer surfaces of the embedded metal traces in the die-side ETS metallization layer of the package substrate in a vertical direction such that the additional metal interconnects are disposed between the die-side ETS metallization layer and the die. As one non-limiting example, the additional metal interconnects could be formed as added metal plating, such as added copper plating, on the embedded metal traces in the die-side ETS metallization layer. As another non-limiting example, additional metal interconnects could also be formed as added metal traces or metal lines coupled to the embedded metal traces in the die-side ETS metallization layer. The additional metal interconnects coupled to the embedded metal traces of the die-side ETS metallization layer that form the die-side metal interconnects of the package substrate can be exposed for connections through openings patterned in a solder resist layer disposed on the supplemental metal layer. Providing the supplemental metal layer in the IC package may add height to the IC package in the vertical direction. However, this added height comes at the benefit of not being required to increase the thickness of one or more metallization layers in the package substrate to avoid or reduce the imbalance in metal density between the die-side ETS metallization layer and another metallization layer(s) in the package substrate.

In this regard, in one exemplary aspect, an IC package is provided. The IC package comprises a package substrate. The package substrate comprises a first metallization layer comprising a first insulating layer; and a first metal layer comprising one or more first metal traces embedded in the first insulating layer. The IC package also comprises a second metal layer disposed adjacent to the first metallization layer. The second metal layer comprises one or more second metal interconnects each coupled to a first metal trace among the one or more first metal traces in the first metal layer of the first metallization layer.

In another exemplary aspect, a method of fabricating an IC package is provided. The method comprises forming a package substrate. Forming the package substrate comprises forming a first metallization layer comprising forming a first insulating layer, and embedding one or more first metal traces in the first insulating layer forming a first metal layer in the first insulating layer. The method also comprises forming one or more second metal interconnects in a second metal layer adjacent to the first metallization layer. The method also comprises coupling each of the one or more second metal interconnects in the second metal layer to a first metal trace among the one or more first metal traces in the first metal layer of the first metallization layer.

BRIEF DESCRIPTION OF THE FIGURES

FIGS. 8A-8E is a flowchart illustrating another exemplary fabrication process of fabricating ETS metallization layer with embedded metal traces, and a supplemental metal layer with additional metal interconnects coupled to the embedded metal traces in the ETS metallization layer to increase the metal density of the embedded metal traces, including but not limited to the ETS metallization layer and supplemental metal layer packages in FIGS. 3A-6B;

FIGS. 9A-9I are exemplary fabrication stages during fabrication of an ETS metallization layer with a supplemental added metal layer according to the fabrication process in FIGS. 8A-8E;

DETAILED DESCRIPTION

Figure 1:
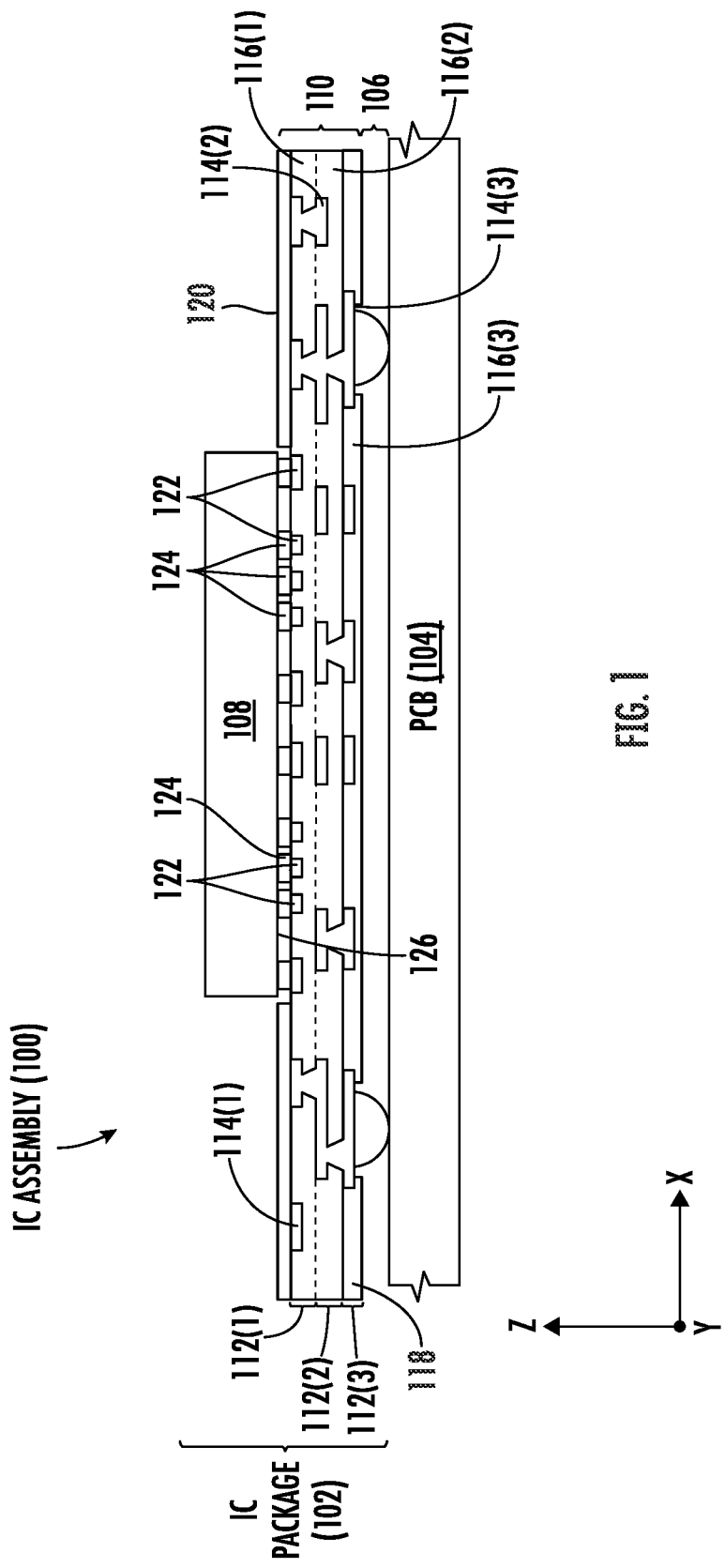
FIG. 1 is a side view of an integrated circuit (IC) package that includes a semiconductor die ("die") mounted on a package substrate that includes an embedded trace substrate (ETS) metallization layer to provide an electrical interface between the package substrate and the die.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include an integrated circuit (IC) package employing a supplemental metal layer coupled to embedded metal traces in a die-side embedded trace substrate (ETS) layer to reduce metal density mismatch. Related fabrication methods are also disclosed. An IC package is provided that includes a semiconductor die ("die") electrically coupled to a package substrate. The package substrate includes a die-side ETS metallization layer adjacent to and coupled to die interconnects (e.g., raised interconnect bumps) of the die to provide an electrical coupling between the die and the package substrate. The die-side ETS metallization layer facilitates providing higher density bump/solder joints with reduced line/spacing ratio (L/S) for providing a higher density electrical interface to the die for higher density signal routing. The embedded metal traces in the die-side ETS metallization layer may be of less area than the area of metal interconnects in other metallization layers in the package substrate due to the metal in the die-side ETS metallization layer being dominated by metal traces, as opposed to for example, metal pads or ground planes. This difference in metal area causes a metal density mismatch between the die-side ETS metallization layer and other metallization layers that causes a mismatch in their coefficient of thermal expansions (CTEs). This mismatch in CTE between the die-side ETS metallization layer and other metallization layers in the package substrate can contribute to increased warpage of the package substrate. Thus, in exemplary aspects, to reduce or avoid this metal density mismatch, a supplemental (i.e., additional) metal layer with additional metal interconnects formed therein, is disposed adjacent to the die-side ETS metallization layer. The additional metal interconnects are coupled in a vertical direction to the embedded metal traces in the die-side ETS metallization layer to form die-side metal interconnects of increased thickness/density in the package substrate. This can reduce or avoid the need to reduce the thickness of metal layers in another metallization layer(s) in the package substrate to reduce the metal density mismatch between the die-side ETS metallization layer and the other metallization layer(s) in the package substrate. For example, reducing the thickness of a metal layer in an external metallization layer of a package substrate supporting external interconnects can lead to increased dimple depth in the metal interconnects therein, that then increases the risk of voids in solder joints coupling the metal interconnects to the external interconnects.

Figure 2A:
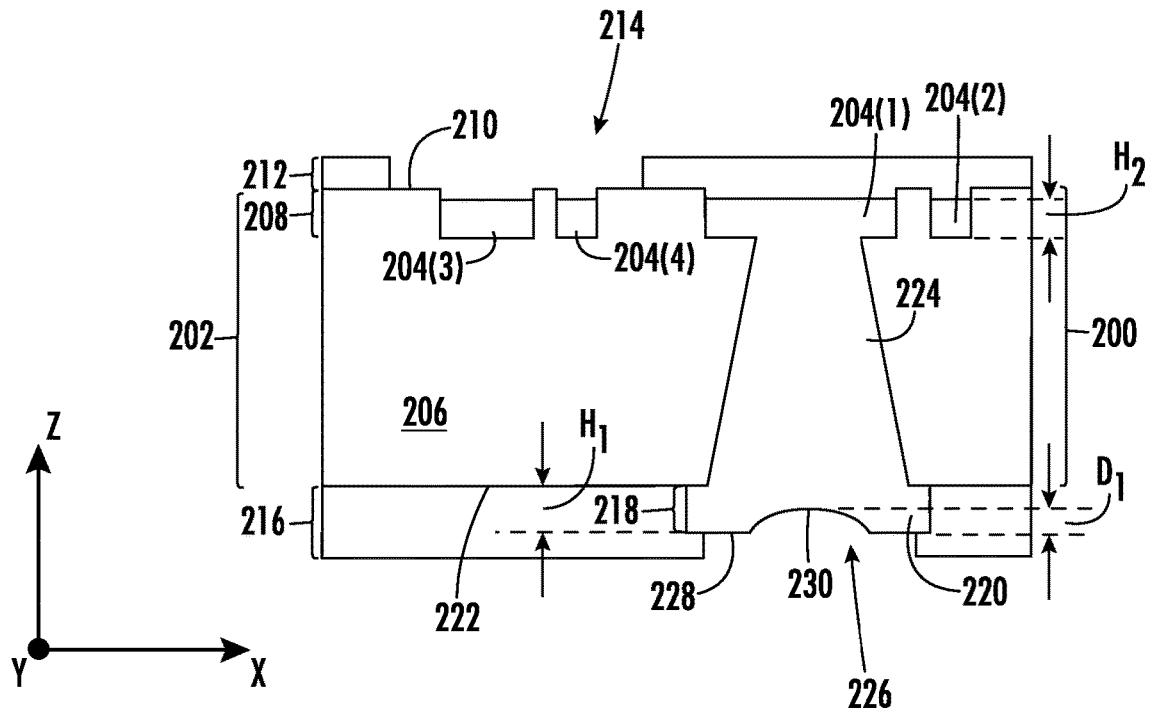
FIG. 2A is a side view of a portion of a package substrate that includes a die-side ETS metallization layer and an external metallization layer with a dimple formed in an external metal interconnect pad.
Figure 2B:
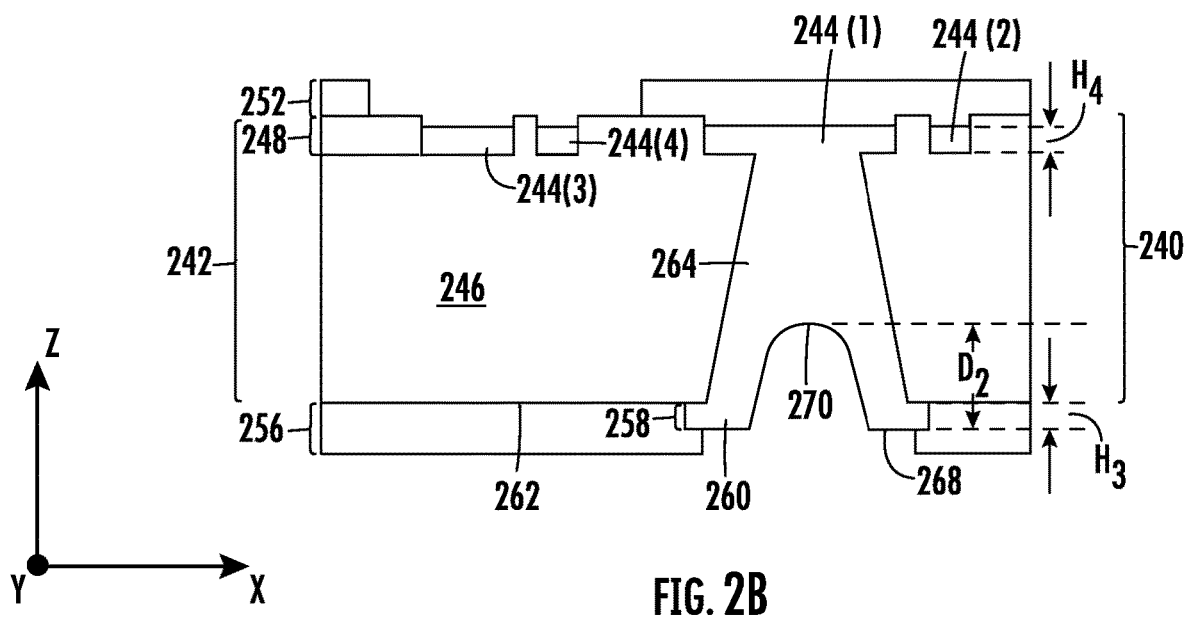
FIG. 2B is a side view of a portion of the package substrate that has a reduced thickness metal layer in a die-side ETS metallization layer over the thickness of the metal layer in the die-side ETS metallization layer in FIG. 2A, and a reduced thickness metal layer in an external metallization layer with a dimple formed in an external metal interconnect pad of greater depth than the external metal interconnect pad in FIG. 2A.
Figure 3A:
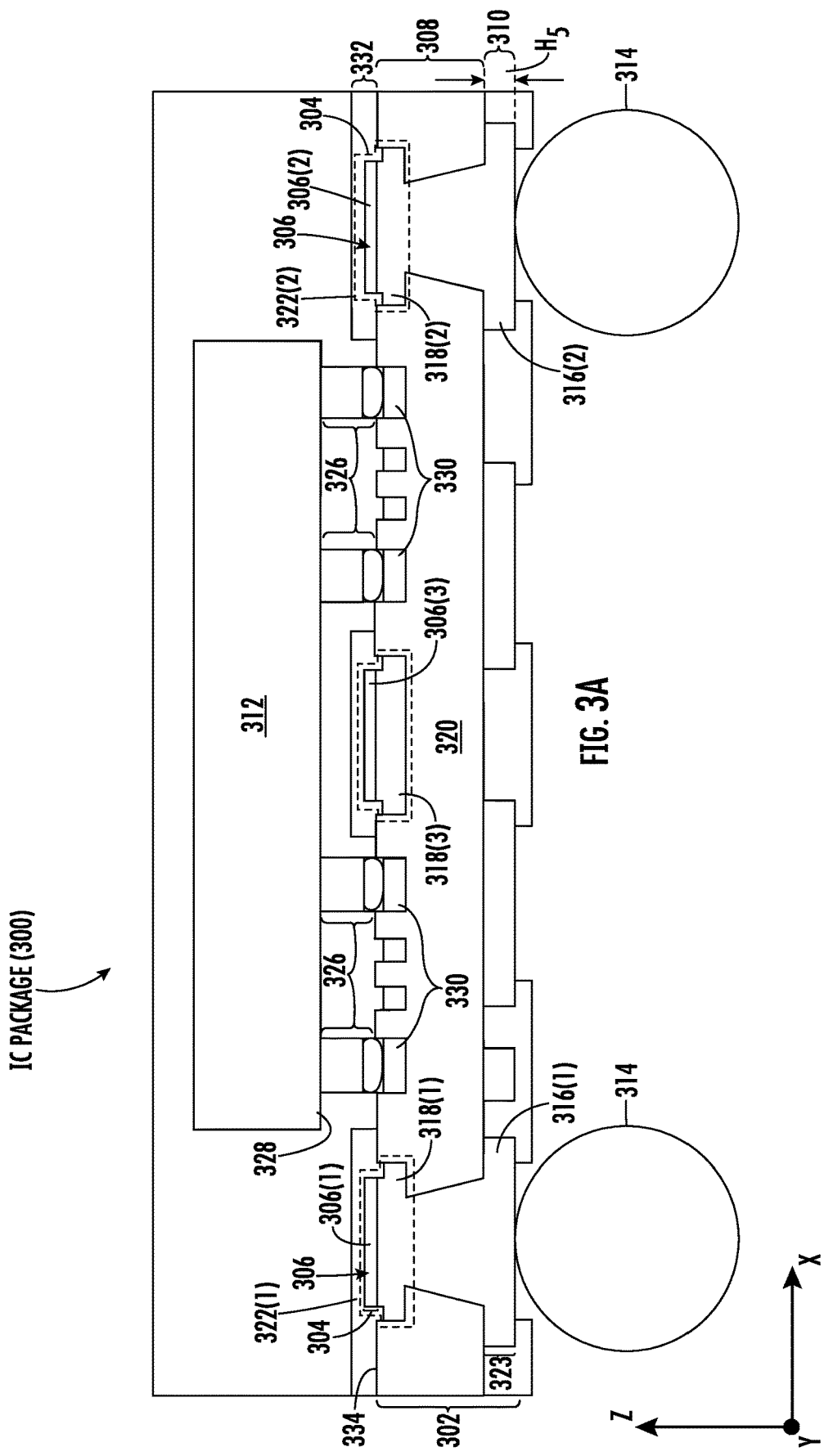
FIG. 3A is a side view of an exemplary IC package that employs a supplemental metal layer with additional metal interconnects coupled to embedded metal traces in a die-side ETS metallization layer of a package substrate to avoid or reduce metal density mismatch between the die-side ETS metallization layer and an external metallization layer supporting external interconnects.

Examples of IC packages that employ a supplemental metal layer with additional metal interconnects coupled to embedded metal traces in a die-side ETS metallization layer of a package substrate to avoid or reduce metal density mismatch between the die-side ETS metallization layer and another metallization layer(s) in the package substrate start at FIG. 3A. Before discussing these IC packages, an IC package that employs a package substrate with a die-side ETS metallization layer that includes embedded metal traces, wherein the IC package does not include a supplemental metal layer with additional metal interconnects coupled to the embedded metal traces is first described below with regard to FIGS. 1-2B.

In this regard, FIG. 1 illustrates a schematic side view of a cross-section of an IC assembly 100 that includes an IC package 102 that is mounted to a printed circuit board (PCB) 104 using external interconnects 106, such as solder balls. The IC package 102 includes a semiconductor die 108 (also referred to as "IC die 108" or "die 108") that is mounted to a package substrate 110 via a die-to-die bonding and/or underfill adhesive. The external interconnects 106 are coupled to metal interconnections in the package substrate 110 to provide an electrical interface to the die 108 when the IC package 102 is mounted to the PCB 104. The package substrate 110 includes a plurality of metallization layers 112(1)-112(3) that include metal interconnects 114(1)-114(3) (e.g., metal traces, metal lines). The metal interconnects 114(1)-114(3) are interconnected to each other to provide signal routing to the die 108 and between the external interconnects 106 to the die 108. Each of the metallization layers 112(1)-112(3) include an insulating layer 116(1)-116(3) to insulate the metal interconnects 114(1)-114(3). The package substrate 110 includes a first solder resist layer 118 and a second solder resist layer 120. The external interconnects 106 are formed in openings in the first solder resist layer 118 coupled to the metal interconnects 114(3) in the bottom metallization layer 112(3).

In this example, the upper metallization layer 112(1) is an ETS metallization layer, wherein the metal interconnects 114(1) are formed as embedded metal traces in the insulating layer 116(1). Thus, the metal interconnects 114(1) are also referred to as embedded metal traces 114(1). The ETS metallization layer 112(1) facilitates providing higher density bump/solder joints with reduced line/spacing ratio (L/S) for electrically coupling the die 108 to the package substrate 110 for signal routing. Raised metal interconnects 122 (e.g., interconnect solder/metal bumps) are formed in contact with the embedded metal traces 114(1) embedded in the ETS metallization layer 112(1). Die interconnects 124 (e.g., raised interconnect bumps) disposed on an active surface 126 of the die 108 are coupled to metal interconnects 114(1) as embedded metal traces 114(1), to provide an electrical coupling between the die 108 and the package substrate 110.

To further illustrate embedded metal traces in an ETS metallization layer, such as embedded metal traces 114(1) in the ETS metallization layer 112(1) in FIG. 1, coupled to an underlying metal interconnect, FIGS. 2A and 2B are provided. FIG. 2A is a side view of a portion of a package substrate 200 that includes an ETS metallization layer 202 that is configured to be coupled to a die (not shown). Thus, the ETS metallization layer 202 can be thought of a "die-side" ETS metallization layer. The ETS metallization layer 202 includes embedded metal traces 204(1)-204(4) embedded in an insulating layer 206, which is a layer made of a dielectric material. The embedding of the embedded metal traces 204(1)-204(4) in the insulating layer 206 forms a first metal layer 208 in the ETS metallization layer 202. The embedded metal traces 204(1)-204(4) are recessed from a top surface 210 of the insulating layer 206 as a result of etching during the fabrication process. A solder resist layer 212 is disposed on the top surface 210 of the insulating layer 206 to insulate and protect portions of the embedded metal traces 204(1)-204(4) that are not connected. Openings 214 are formed in the solder resist layer 212 to expose the embedded metal traces 204(3), 204(4) to be connected as part of an IC package.

With continuing reference to FIG. 2A, the package substrate 200 also includes a second metallization layer 216 disposed below the ETS metallization layer 202 in the vertical direction (Z-axis direction). The second metallization layer 216 includes a second metal layer 218 that includes a second metal interconnect 220 formed on a bottom surface 222 of the insulating layer 206 of the ETS metallization layer 202. The second metal interconnect 220 is coupled to the embedded metal traces 204(1) through a vertical interconnect access (via) 224 (e.g., a metal pillar, metal trace, or other metal interconnect) extending in the vertical direction (Z-axis direction) between the second metal interconnect 220 and the embedded metal trace 204 (1). Signals can be routed in the package substrate 200 between the embedded metal trace 204(1) and the second metal interconnect 220. In this example, the second metallization layer 216 is an external metallization layer of the package substrate 200 that is configured facilitate the formation of external interconnects (e.g., solder bumps, ball grid array (BGA) interconnects) to provide an external interface to the package substrate 200 and its IC package. In this regard, an opening 226 is formed to expose a bottom surface 228 of second metal interconnect 220 so that an external interconnect can be formed in the opening 226 and a solder joint formed between the external interconnect and the second metal interconnect 220. As shown in FIG. 2A, a dimple 230 is formed in the bottom surface 228 of the second metal interconnect 220 as a result of etching in the fabrication of the package substrate 200.

In the example package substrate 200 in FIG. 2A, the dimple 230 is not of a sufficient depth $D_1$ from the bottom surface 228 to risk a void in a solder joint coupling the second metal interconnect 220 to an external interconnect that can risk the integrity of the connection between the second metal interconnect 220 and an external interconnect. This is because a height $H_1$ (i.e., thickness) of the second metal interconnect 220 in the vertical direction (Z-axis direction) is not sufficiently small such that etching during fabrication will form the dimple 230 of a larger depth $D_1$ that risks solder joint voids. The height $H_1$ of the second metal interconnect 220 is based on a height $H_2$ (i.e., thickness) of the first metal layer 208 of the ETS metallization layer 202 in the vertical direction (Z-axis direction). This is to reduce or mitigate a metal density mismatch between the first metal layer 208 in the ETS metallization layer 202 and second metal interconnects 220 in the second metallization layer 216. In this example, because the ETS metallization layer 202 is a die-side metallization layer coupled to a die, the area of the embedded metal traces 204(1)-204(4) may be less than the area of the second metal interconnects 220 in the second metallization layer 216 due to the metal in the ETS metallization layer 202 being dominated by metal traces, as opposed to for example, metal pads or ground planes. This metal density mismatch can cause a coefficient of thermal expansion (CTE) mismatch between the ETS metallization layer 202 and the second metallization layer 216 that can contribute to increased warpage of the package substrate 200. To reduce or avoid this metal density mismatch between the ETS metallization layer 202 and the second metallization layer 216, the height $H_1$ of the second metal layer 218 of the second metallization layer 216 is decreased from the height $H_2$ of the first metal layer 208 of the ETS metallization layer 202. The decrease in height $H_1$ of the second metal layer 218 of the second metallization layer 216 reduces the metal density (volume) of the second metallization layer 216 to attempt to balance the metal density between the second metallization layer 216 and the ETS metallization layer 202. For example, the height $H_2$ of the first metal layer 208 may be eighteen (18) micrometers (μm), and the height $H_1$ of the second metal layer 218 may be fifteen (15) μm.

As it becomes desired to further reduce the L/S ratio of the embedded metal traces 204(1)-204(4) in the ETS metallization layer 202 to support a higher density of interconnections with a die, it may become necessary to reduce the height $H_2$ (i.e., thickness) of the first metal layer 208 in the ETS metallization layer 202. This is due to the limitations of a patterning process during fabrication of the ETS metallization layer 202. This is shown in the side view of an exemplary package substrate 240 in FIG. 2B that is similar to the package substrate 200 in FIG. 2A. As shown in FIG. 2B, the package substrate 240 includes an ETS metallization layer 242 that includes embedded metal traces 244(1)-244 (4) embedded in an insulating layer 246, which is a layer made of a dielectric material. The embedding of the embedded metal traces 244(1)-244(4) in the insulating layer 246 forms a first metal layer 248 in the ETS metallization layer 242(1). A solder resist layer 252 is disposed on the insulating layer 246 to insulate and protect portions of the embedded metal traces 244(1)-244(4) that are not connected. The package substrate 240 also includes a second metallization layer 256 disposed below the ETS metallization layer 242 in the vertical direction (Z-axis direction). The second metallization layer 256 includes a second metal layer 258 that includes a second metal interconnect 260 formed on a bottom surface 262 of the insulating layer 206 of the ETS metallization layer 202. The second metal interconnect 260 is coupled to the embedded metal traces 244(1) through a vertical interconnect access (via) 264 (e.g., a metal pillar, metal trace, or other metal interconnect) extending in the vertical direction (Z-axis direction) between the second metal interconnect 260 and the embedded metal trace 244 (1).

As shown in FIG. 2B, the second metal interconnect 260 has a height $H_3$ (i.e., thickness) that is based on a height $H_4$ (i.e., thickness) of the first metal layer 248 of the ETS metallization layer 242 in the vertical direction (Z-axis direction). To reduce or avoid this metal density mismatch between the ETS metallization layer 242 and the second metallization layer 256, a height $H_3$ of the second metal layer 258 of the second metallization layer 256 is decreased from a height $H_4$ of the first metal layer 248 of the ETS metallization layer 242. The decrease in height $H_3$ of the second metal layer 258 of the second metallization layer 256 reduces the metal density (volume) of the second metallization layer 256 to attempt to balance the metal density between the second metallization layer 256 and the ETS metallization layer 242. For example, the height $H_4$ of the first metal layer 248 may be twelve (12) micrometers (μm), and the height $H_3$ of the second metal layer 258 may be ten (10) μm.

As shown in FIG. 2B, a dimple 270 is formed in a bottom surface 268 of the second metal interconnect 260 as a result of etching in the fabrication of the package substrate 240. However in this, the dimple 270 is of a sufficient depth $D_2$ from the bottom surface 268 of the second metallization layer 256 to risk a void in a solder joint coupling the second metal interconnect 260 to an external interconnect that can risk the integrity of the connection between the second metal interconnect 260 and an external interconnect. This is because the height $H_3$ (i.e., thickness) of the second metal interconnect 260 in the vertical direction (Z-axis direction) is reduced making the second metal interconnect 260 thinner in thickness. The metal etching that occurs in the fabrication of the package substrate 200, and that causes the bottom surface 268 of the second metal interconnect 260 to be etched, provides the dimple 270 of a larger depth $D_2$ from the bottom surface 268 of the second metal interconnect 260. This increases the risk of voids in a solder joint formed in contact with the second metal interconnect 260. If the height $H_3$ (i.e., thickness) of the second metal interconnect 260 is increased to reduce the depth $D_2$ of the dimple 270, this increases any metal density mismatch between the second metallization layer 256 and the ETS metallization layer 242 unless the height $H_4$ (i.e., thickness) of the first metal layer 248 in the ETS metallization layer 242 is increased. This may not be possible and still achieve the desired L/S of the embedded metal traces 244(1)-244(4) in the ETS metallization layer 242.

In this regard, it is desired to be able to reduce the thickness of a metal layer in an ETS metallization layer, such as a die-side ETS metallization layer, in a package substrate while also avoiding the need to unduly reduce the thickness of metal layers in other metallization layers, including in an external metallization layer, to reduce or avoid metal density mismatch. As discussed above in the example package substrate 240 in FIG. 2B, reducing thickness in an external metallization layer can risk voids in solder joints formed in contact with metal interconnects in the external metallization layer that are coupled to external interconnects (e.g., BGA interconnects).

Figure 3B:
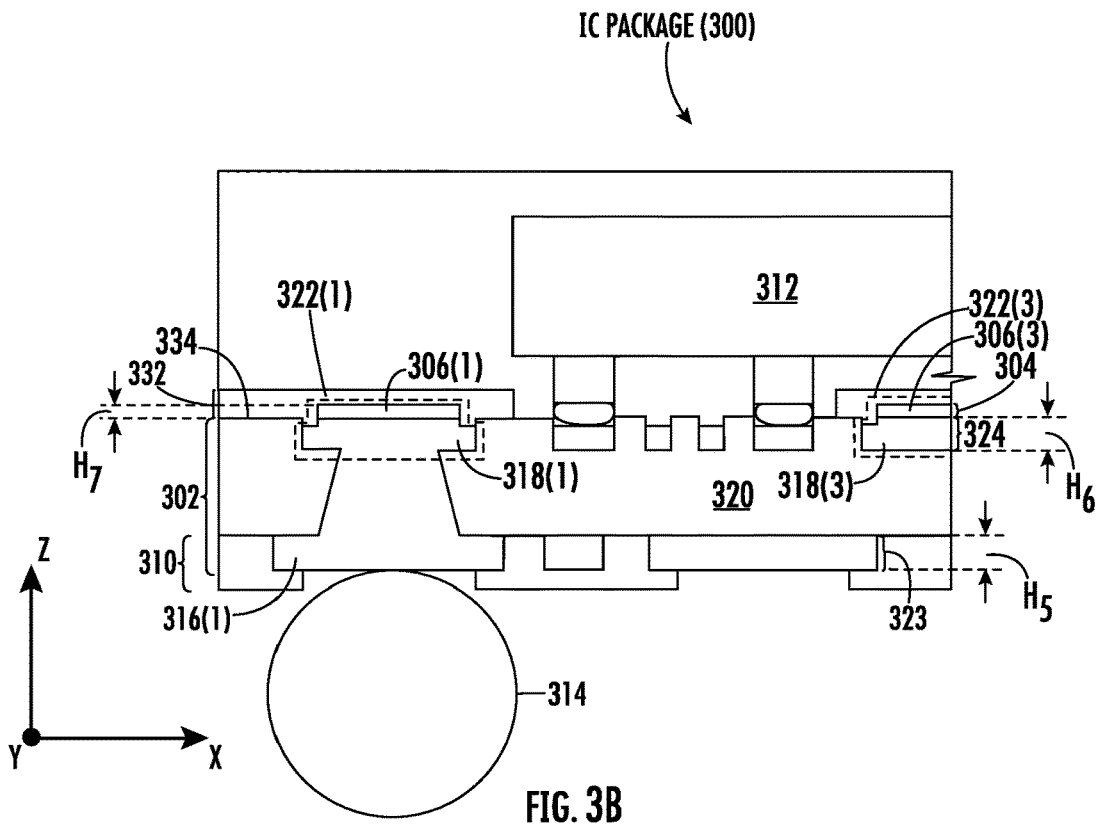
FIGS. 3B and 3C are close-up left side views of the IC package in FIG. 3A.

In this regard, FIGS. 3A and 3B are side views of an exemplary IC package 300 that includes a package substrate 302 and wherein the IC package 300 also that employs a second metal layer 304 referred to herein as a "supplemental metal layer 304" (e.g., a copper layer) with additional second metal interconnects 306 to reduce or avoid metal density mismatch between an ETS metallization layer 308 and a third, external metallization layer 310. The supplemental metal layer 304 is outside of the package substrate 302 and is formed adjacent to and in contact with the ETS metallization layer 308 in this example. In this example, as shown in FIG. 3A, the ETS metallization layer 308 is a die-side metallization layer that is disposed adjacent to a coupled die 312 in the IC package 300. Also in this example, the third metallization layer 310 is an external interconnect-side metallization layer that facilitates the formation of external interconnects 314 (e.g., solder bumps, metal pillars, BGA interconnects) coupled to second metal interconnects 316(1), 316(2) in the third, external metallization layer 310. As discussed in more detail below and as shown in FIG. 3A, additional metal interconnects 306(1)-306(3) in the supplemental metal layer 304 are coupled in a vertical direction (Z-axis direction) to the respective embedded metal traces 318(1)-318(3) embedded in an insulating layer 320 of the die-side ETS metallization layer 308 to form die-side metal interconnects 322(1)-322(3) of increased thickness/density in the package substrate 302. This can reduce or avoid the need to reduce a height $H_5$ (i.e., thickness) of a third metal layer 323 of the third, external metallization layer 310 to avoid or reduce metal density mismatch between the die-side ETS metallization layer 308 and the third, external metallization layer 310 in the package substrate 302. For example, reducing the height $H_5$ (i.e., thickness) of the third metal layer 323 in the third, external metallization layer 310 can lead to increased dimple depth in the second metal interconnects 316(1), 316(2) in the third metal layer 323, that then increases the risk of voids in solder joints coupling the second metal interconnects 316(1), 316(2) to the external interconnects 314.

With reference to FIGS. 3A and 3B, the embedded metal traces 318(1)-318(3) embedded in the insulating layer 320 of the ETS metallization layer 308 form a metal layer 324 in the insulating layer 320. A height $H_6$ (i.e., thickness) of the metal layer 324 controls the maximum height of the embedded metal traces 318(1)-318(3). Thus, the height $H_6$ of the metal layer 324 of the ETS metallization layer 308 affects the metal density of the embedded metal traces 318(1)-318(3). In this example, the height $H_6$ of the metal layer 324 of the ETS metallization layer 308 is less than the height Hs of the third metal layer 323 of the third, external metallization layer 310. This may allow a tighter (smaller) L/S of formed embedded metal traces 318(1)-318(3) embedded in the insulating layer 320 in the ETS metallization layer 308 to support a higher connection density to the package substrate 302. However, this also causes the metal density of the ETS metallization layer 308 to be less than the metal density of the third, external metallization layer 310. Thus, instead of increasing the height Hs of the third metal layer 323 of the third, external metallization layer 310 to compensate for this metal density imbalance, the supplemental metal layer 304 is provided and disposed on the ETS metallization layer 308 in a vertical direction (Z-axis direction) with the additional metal interconnects 306 of the supplemental metal layer 304 being coupled to respective embedded metal traces 318(1)-318(3). For example, additional metal interconnects 306 of the supplemental metal layer 304 may be directly coupled to respective embedded metal traces 318(1)-318(3) of the ETS metallization layer 308 in the vertical direction (Z-axis direction). The combination of the additional metal interconnects 306 of the supplemental metal layer 304 coupled to respective embedded metal traces 318(1)-318(3) forms die-side metal interconnects 322(1)-322(3) of increased metal density to avoid or reduce the metal density imbalance, and thus CTE imbalance, between the ETS metallization layer 308 and the third, external metallization layer 310 to reduce or avoid warpage of the package substrate 302.

With reference to FIG. 3A, the IC package 300 includes the die 312. As shown in FIG. 3B, the die 312 is coupled through die interconnects 326 (e.g., raised interconnect bumps) to the package substrate 302. More specifically, the die interconnects 326 extending from an active side 328 of the die 312 are coupled to other embedded metal traces 330 embedded in the insulating layer 320 of the ETS metallization layer 308. Select die interconnects 326 that are designated to provide an external signal interface to the IC package 300 can be coupled through the ETS metallization layer 308 to second metal interconnects 316(1), 316(2) in the third, external metallization layer 310 to provide a signal routing path between the die 312 and external interconnects 314. In this example as shown in FIG. 3A, the supplemental metal layer 304 is disposed both inside and outside of the vertical area in the vertical direction (Z-axis direction) between the die 312 and the package substrate 302. The additional metal interconnects 306(1), 306(2) of the supplemental metal layer 304 are disposed outside of the vertical area in the vertical direction (Z-axis direction) between the die 312 and the package substrate 302. This may be because the embedded metal traces 318(1), 318(2) coupled to the additional metal interconnects 306(1), 306(2) are for providing connections that are not directly coupled to the die 312, such as for a ground plane. The additional metal interconnect 306(3) of the supplemental metal layer 304 is disposed inside of the vertical area in the vertical direction (Z-axis direction) between the die 312 and the package substrate 302. This may be because the embedded metal trace 318(3) coupled to the additional metal interconnects 306(3) is for providing a connection to the die 312 through a die interconnect 326.

With reference to FIGS. 3A and 3B, in this example, a solder resist layer 332 is disposed adjacent to a first, outer surface 334 of the insulating layer 320 of the ETS metallization layer 308. The supplemental metal layer 304 is also disposed adjacent to the first, outer surface 334 of the insulating layer 320 of the ETS metallization layer 308. The solder resist layer 332 is disposed over the additional metal interconnects 306(1)-306(3) in the supplemental metal layer 304. Thus, the supplemental metal layer 304 can be thought of as being disposed in the solder resist layer 332. The additional metal interconnects 306(1)-306(3) are not contained in or embedded in the insulating layer 320 of the ETS metallization layer 308 in this example.

As discussed above, the height $H_6$ of the metal layer 324 (or its embedded metal traces 318(1)-318(3)) of the ETS metallization layer 308 is less than the height $H_5$ of the third metal layer 323 (or its second metal interconnects 316(1)-316(3)) of the third, external metallization layer 310. The coupling of the additional metal interconnects 306(1)-306(3) to the respective embedded metal traces 318(1)-318(3) avoids or reduces the metal density imbalance between the ETS metallization layer 308 and the third, external metallization layer 310. For example, the height $H_6$ of the metal layer 324 of the ETS metallization layer 308 in the vertical direction (Z-axis direction) may be between eight (8) and fourteen (14) micrometers (μm). As another example, the height Hs of the third metal layer 323 in the third, external metallization layer 310 may be between ten (10) and twenty (20) μm. As another example, as shown in FIG. 3B, a height $H_7$ of the supplemental metal layer 304 (or its additional metal interconnects 306(1)-306(3)) in the vertical direction (Z-axis direction) may be between one (1) and five (5) μm. Thus, as an example, a ratio of the height $H_6$ of the metal layer 324 of the ETS metallization layer 308 to the height $H_7$ of the supplemental metal layer 304 may be at least 8/5. And as another example, a ratio of the height $H_6$ of the metal layer 324 of the ETS metallization layer 308 to the height Hs of the third metal layer 323 in the third, external metallization layer 310 may be at least 8/20.

Thus, in these examples, the additional metal interconnects 306(1)-306(3) being coupled to the embedded metal traces 318(1)-318(3) raises the effective height of the embedded metal traces 318(1)-318(3) to the height $H_6$ and the height $H_7$ combined (e.g., 20 μm) to provide effective die-side metal interconnects 322(1)-322(3) of increased metal density. For an example of a 7/9 L/S of the embedded metal traces 318(1)-318(3) in the metal layer 324 of the ETS metallization layer 308, the height $H_6$ of the metal layer 324 of the ETS metallization layer 308 may be fourteen (14) μm, the height Hs of the third metal layer 323 in the third, external metallization layer 310 may be fifteen (15) μm, and the height $H_7$ of the supplemental metal layer 304 may be four (4) μm. For an example of a 6/8 L/S of the embedded metal traces 318(1)-318(3) in the metal layer 324 of the ETS metallization layer 308, the height $H_6$ of the metal layer 324 of the ETS metallization layer 308 may be twelve (12) μm, the height Hs of the third metal layer 323 in the third, external metallization layer 310 may be fifteen (15) μm, and the height $H_7$ of the supplemental metal layer 304 may be four (4) μm.

Note that as a result of the metal etching of the supplemental metal layer 304 to form the additional metal interconnects 306(1)-306(3) in the fabrication of the ETS metallization layer 308 in the package substrate 302 in FIGS. 3A and 3B, end portions of the embedded metal traces 318(1)-318(2) may be recessed below the outer, top surface 334 of the insulating layer 320. As discussed in fabrication process in more detail below, these recesses formed in the embedded metal traces 318(1)-318(3) are a result of using the embedded metal traces 318(1)-318(3) as an alignment mechanism for etching a supplemental metal layer 504 to leave portions resident to form the additional metal interconnects 306(1)-306(3). Other embedded metal traces 518(2), 518(3) in the ETS metallization layer also have inner and outer metal portions that form recesses like embedded metal traces 518(1).

Figure 3C:
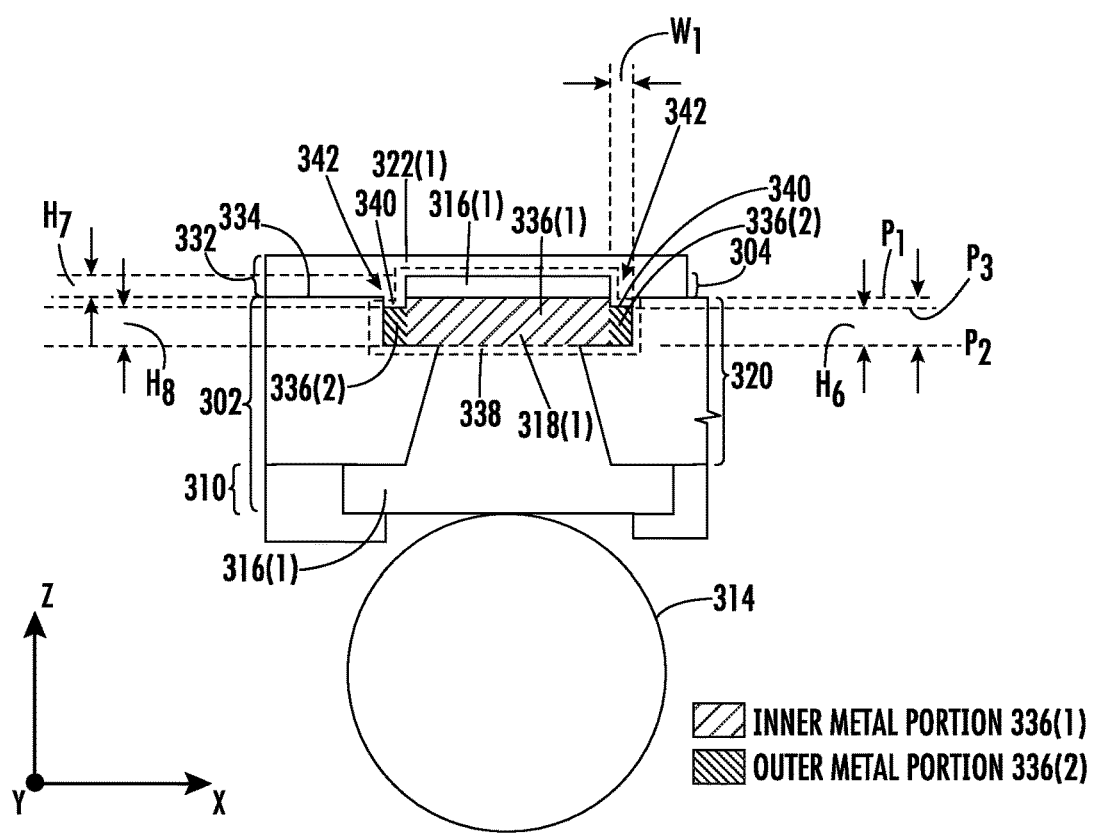

As shown in FIG. 3C, the first, outer surface 334 of the insulating layer 320 is disposed in a first horizontal plane $P_1$ in a horizontal direction (X- and Y-axes direction). The embedded metal trace 318(1) has an inner metal portion 336(1) that has a top, outer surface 338 that extends to the first horizontal plane P1 in the vertical direction (Z-axis direction), which may be co-planar with the outer, top surface 334 of the insulating layer 320. The inner metal portion 336(1) of the embedded metal trace 318(1) has the height $H_6$ from a bottom surface 338 of the embedded metal trace 318(1). The bottom surface 338 of the embedded metal trace 318(1) is disposed in a second horizontal plane P2 in a horizontal direction (X- and Y-axes directions). The embedded metal trace 318(1) also has an outer metal portion 336(2) that surrounds the inner metal portion 336(1). The outer metal portion 336(2) of the embedded metal trace 318(1) has a top, outer surface 340 that does not extend up to the first horizontal plane $P_1$ in the vertical direction (Z-axis direction), but extends to a third horizontal plane $P_3$ below the first horizontal plane $P_1$ in the vertical direction (Z-axis direction). The outer metal portion 336(2) of the embedded metal trace 318(1) also shares the same bottom surface 338 with the inner metal portion 336(1) disposed in the second horizontal plane $P_2$. The outer metal portion 336(2) of the embedded metal trace 318(1) has a height $H_8$ from the bottom surface 338 to its top, outer surface 340, which is less than the height $H_6$ of the inner metal portion 336(1) of the embedded metal trace 318(1). In this manner, a recess 342 is formed between the intersection of the inner metal portion 336(1) and the outer metal portion 336(2) of the embedded metal trace 318(1). The recess 342 has a width Wi in the horizontal direction (X- and/or Y-axes directions), which may be ten (10) μm as an example.

Figure 4:
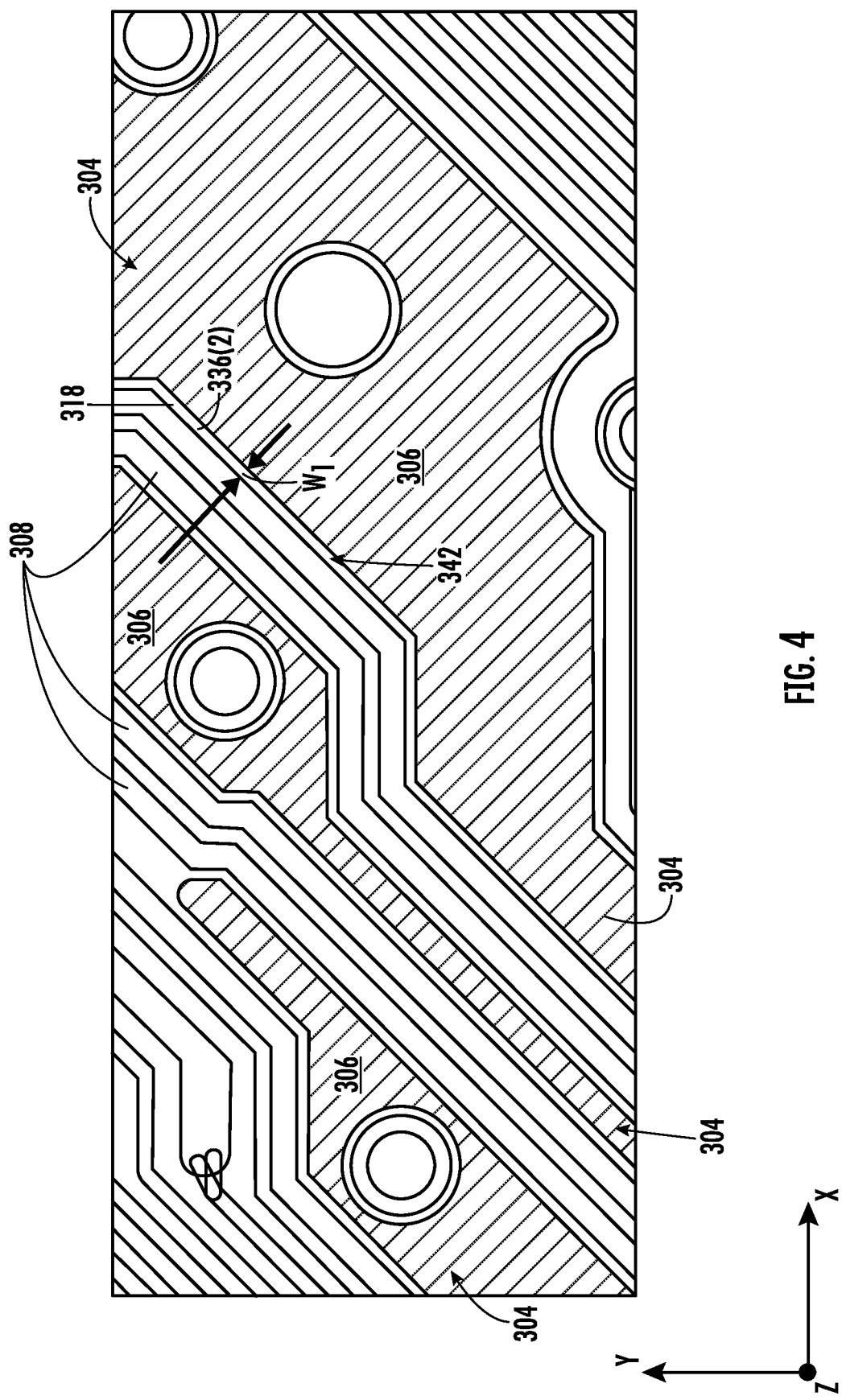
FIG. 4 is a top view of an exemplary supplemental metal layer disposed on a die-side ETS metallization layer in a package substrate showing additional metal interconnects coupled to embedded metal traces in the die-side ETS metallization layer of a package substrate, wherein the additional metal interconnects are inwardly offset from the embedded metal traces in a vertical direction.

FIG. 4 is a top view of the supplemental metal layer 304 in the package substrate 302 in FIGS. 3A-3C disposed on the die-side ETS metallization layer 308. FIG. 4 shows the additional metal interconnects 306 disposed on and above embedded metal traces 318 in the die-side ETS metallization layer 308. In FIG. 4, the die-side ETS metallization layer 308 is disposed underneath the supplemental metal layer 304 in the vertical direction (Z-axis direction). FIG. 4 also shows the offset and recess 342 between the additional metal interconnects 306 and the outer metal portion 336(2) of the embedded metal traces 318.

An IC package that includes a package substrate that employs a supplemental metal layer with additional metal interconnects coupled to embedded metal traces in a die-side ETS metallization layer to avoid or reduce metal density mismatch can also be provided in other types of IC packages. For example, FIG. 5 is a side view of a stacked-die IC package 500 that can include a supplemental metal layer with additional metal interconnects coupled to embedded metal traces in a die-side ETS metallization layer 508 to avoid or reduce metal density mismatch between the die-side ETS metallization layer 508 and a third, external metallization layer 510 supporting external interconnects 514.

Figure 5:
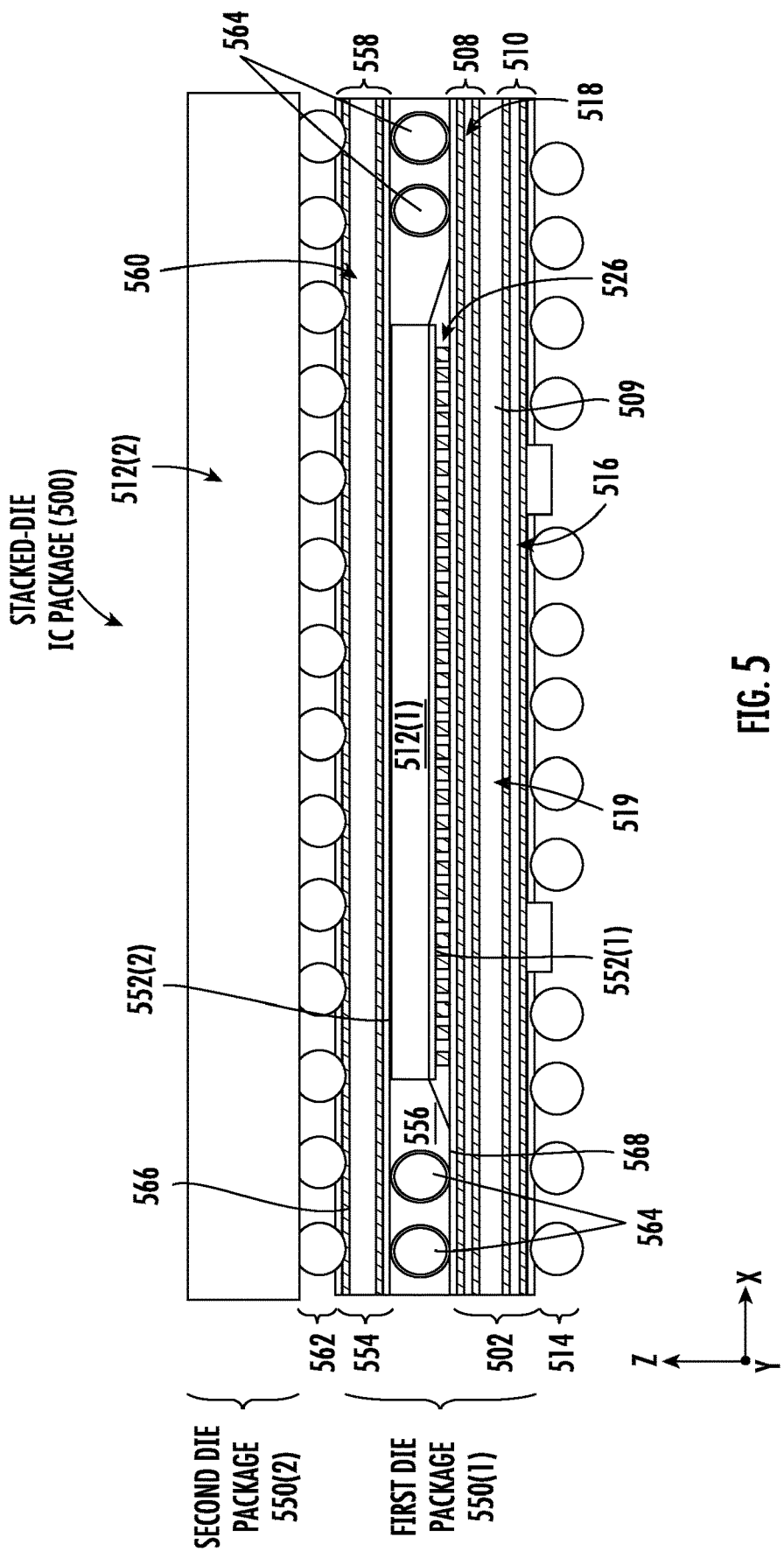
FIG. 5 is a side view of another exemplary IC package that is a stacked-die IC package with a second die package stacked on and electrically connected to the first die package through an interposer substrate in the first die package, wherein the IC package employs a supplemental metal layer with additional metal interconnects coupled to embedded metal traces in a die-side ETS metallization layer of a package substrate to avoid or reduce metal density mismatch between the die-side ETS metallization layer and an external metallization layer supporting external interconnects.

With reference to FIG. 5, the stacked-die IC package 500 includes multiple dies 512(1), 512(2) that are included in respective die packages 550(1), 550(2) and that are stacked in top of each other in the vertical direction (Z-axis direction). The first die package 550(1) of the stacked-die IC package 500 includes the die 512(1) coupled to a package substrate 502. In this example, the package substrate 502 includes a first, upper ETS metallization layer 508(1) disposed on a core substrate 509. The core substrate 509 is disposed on a bottom, third, external metallization layer 510. The ETS metallization layer 508 provides an electrical interface for signal routing to the first die 512(1). The first die 512(1) is coupled to die interconnects 526 (e.g., raised metal bumps) that are electrically coupled to embedded metal traces 518(1) in the ETS metallization layer 508. The embedded metal traces 518 in the ETS metallization layer 508 are coupled to metal interconnects 519 in the core substrate 509, which are coupled to metal interconnects 516 in the third, external metallization layer 510. In this manner, the package substrate 502 provides interconnections between its metallization layers 508, 510, and core substrate 509 to provide signal routing to the first die 512(1). The external interconnects 514 (e.g., ball grid array (BGA) interconnects) are coupled to metal interconnects 516 in the third, external metallization layer 510 to provide interconnections through the package substrate 502 to the first die 512(1) through the die interconnects 526. In this example, a first, active side 552(1) of the first die 512(1) is adjacent to and coupled to the package substrate 502, and more specifically the ETS metallization layer 508 of the package substrate 502.

In the example stacked-die IC package 500 in FIG. 5, a second die package 550(2) is provided and coupled to the first die package 550(1) to support multiple dies. For example, the first die 512(1) in the first die package 550(1) may include an application processor, and the second die 512(2) may be a memory die, such as a dynamic random access memory (DRAM) die that provides memory support for the application processor. In this regard, in this example, the first die package 550(1) also includes an interposer substrate 554 that is disposed on a package mold 556 encasing the first die 512(1), adjacent to a second, inactive side 552(2) of the first die 512(1). The interposer substrate 554 also includes one or more metallization layers 558 that each includes external, metal interconnects 560 to provide interconnections to the second die 512(2) in the second die package 550(2). The second die package 550(2) is physically and electrically coupled to the first die package 550(1) by being coupled through external, metal interconnects 560 (e.g., solder bumps, BGA interconnects) to the interposer substrate 554. The external interconnects 562 are coupled to the external, metal interconnects 560 in the interposer substrate 554.

To provide interconnections to route signals from the second die 512(2) through the external interconnects 562 and the interposer substrate 554 to the first die 512(1), vertical interconnects 564 (e.g., metal pillars, metal posts, metal vertical interconnect accesses (vias), such as through-mold vias (TMVs)) are disposed in the package mold 556 of the first die package 550(1). The vertical interconnects 564 extend from a first, bottom surface 566 of the interposer substrate 554 to a first, top surface 568 of the package substrate 502 in the vertical direction (Z-axis direction) in this example. The vertical interconnects 564 are coupled to the external, metal interconnects 560 in the interposer substrate 554 adjacent bottom surface 566 of the interposer substrate 554. The vertical interconnects 564 are also coupled to embedded metal traces 518 in the ETS metallization layer 508 of the package substrate 502 adjacent to the first, top surface 568 of the package substrate 502. In this manner, the vertical interconnects 564 provide a bridge for interconnections, such as input/output (I/O) connections, between the interposer substrate 554 and the package substrate 502. This provides signal routing paths between the second die 512(2) in the second die package 550(2) and the first die 512(1) in the first die package 550(1), and to the external interconnects 514 through the package substrate 502.

A second, supplemental metal layer can also be provided in the stacked-die IC package 500 in FIG. 5 and disposed adjacent to the ETS metallization layer 508 of the package substrate 502, between the ETS metallization layer 508 and the first die 512(1). The supplemental metal layer can include additional metal interconnects that are each coupled to embedded metal traces 518 in the ETS metallization layer 508 to provide connectivity while increasing the metal density of the ETS metallization layer 508. For example, die interconnects 526 could be coupled to the additional metal interconnects to the supplemental metal layer to couple the first die 512(1) to ETS metallization layer 508 of the package substrate 502. As another example, the vertical interconnects 564 could be coupled to additional metal interconnects and to a supplemental metal layer, to couple the second die 512(2) in the second die package 550(2), through the interposer substrate 554, to the ETS metallization layer 508 of the package substrate 502.

Figure 6A:
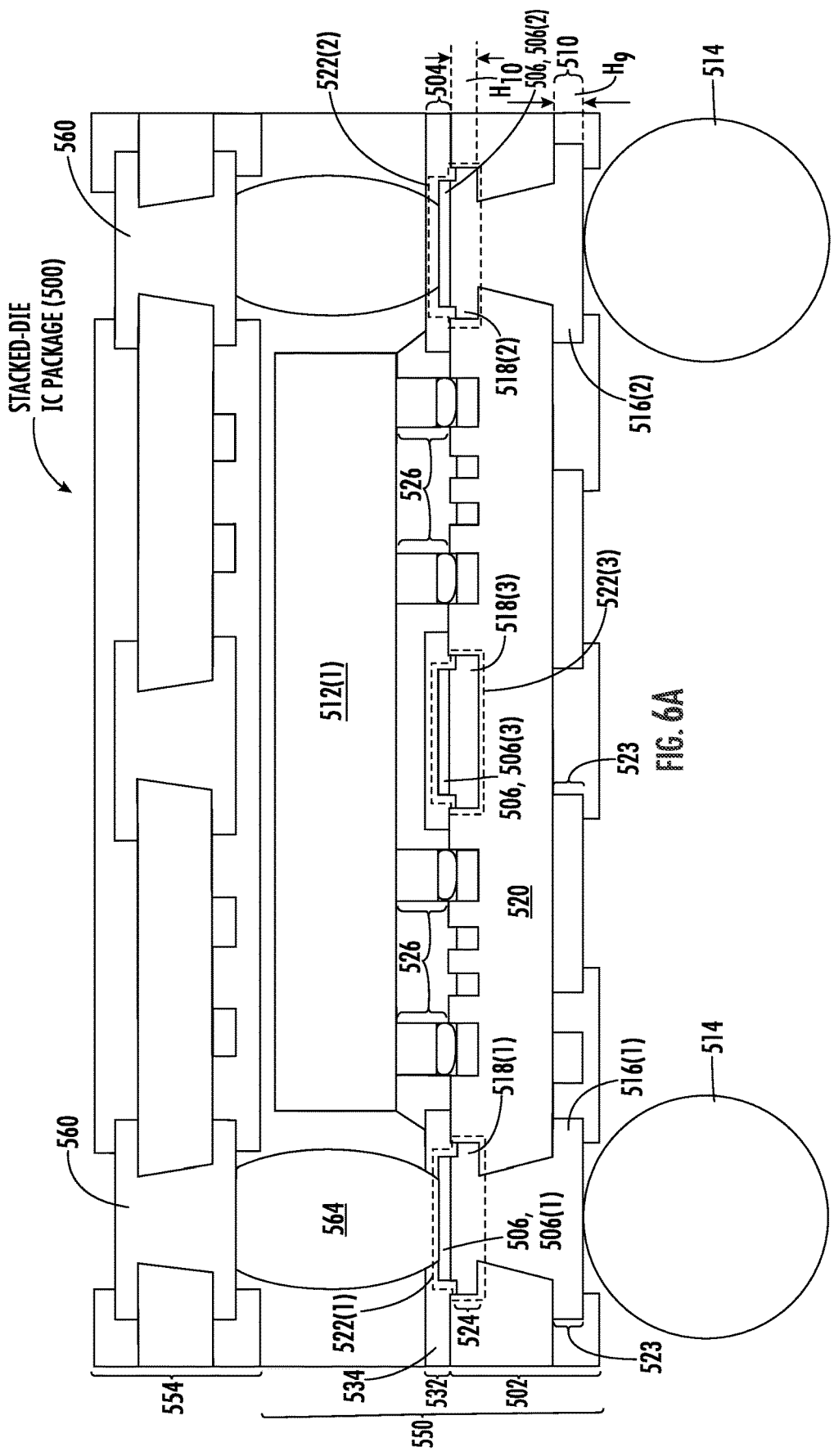
FIG. 6A is a side view of the first die package of the stacked-die IC package in FIG. 5.
Figure 6B:
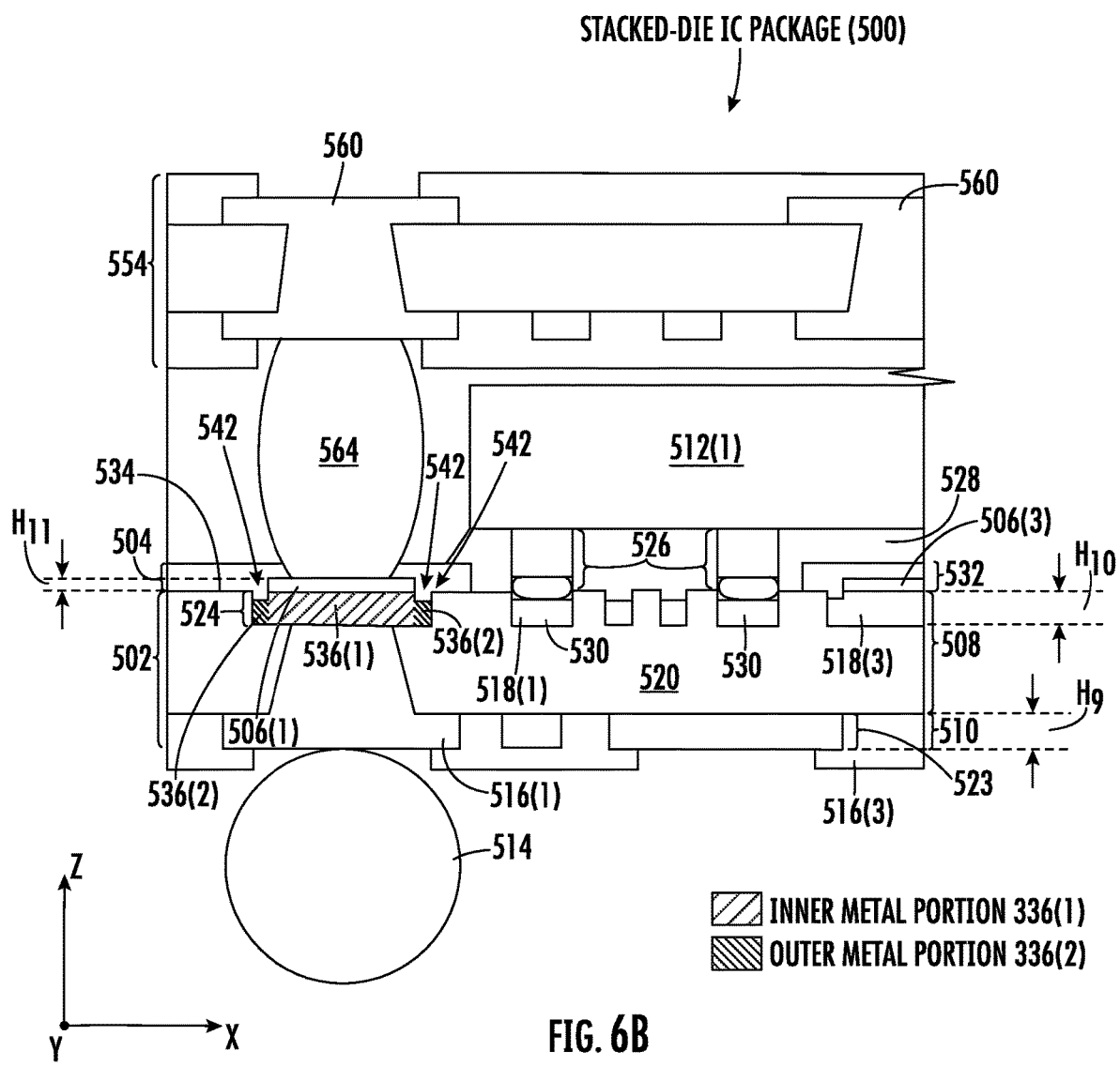
FIG. 6B is a close-up left side view of the first die package of the stacked-die IC package in FIG. 6A.

In this regard, FIGS. 6A and 6B are side views of the stacked-die IC package 500 in FIG. 5 that shows the package substrate 502 that employs a supplemental metal layer 504 (e.g., a copper layer) with additional metal interconnects 506 to reduce or avoid metal density mismatch between the ETS metallization layer 508 and the third, external metallization layer 510. The second, supplemental metal layer 504 is outside of the package substrate 502 and is formed adjacent to and in contact with the ETS metallization layer 508 in this example. In this example, as shown in FIG. 6A, the ETS metallization layer 508 is a die-side metallization layer that is disposed adjacent to the coupled first die 512(1) in the IC package 500. Also in this example, the third, external metallization layer 510 is an external interconnect-side metallization layer that facilitates the formation of the external interconnects 514 (e.g., solder bumps, metal pillars, BGA interconnects) coupled to second metal interconnects 516(1), 516(2) in the third, external metallization layer 510. As discussed in more detail below and as shown in FIG. 6A, additional metal interconnects 506(1)-506(3) in the supplemental metal layer 504 are coupled in a vertical direction (Z-axis direction) to the embedded metal traces 518(1)-518(3) embedded in an insulating layer 520 of the die-side ETS metallization layer 508 to form die-side metal interconnects 522(1)-522(3) of increased thickness/density in the package substrate 502. This can reduce or avoid the need to reduce a height $H_9$ (i.e., thickness) of a third metal layer 523 of the third, external metallization layer 510 to avoid or reduce metal density mismatch between the die-side ETS metallization layer 508 and the third, external metallization layer 510 in the package substrate 502. For example, reducing the height $H_9$ (i.e., thickness) of the third metal layer in the third, external metallization layer 510 can lead to increased dimple depth in the second metal interconnects 516(1), 516(2) in the third metal layer 523, that then increases the risk of voids in solder joints coupling the second metal interconnects 516(1), 516(2) to the external interconnects 514.

With reference to FIGS. 6A and 6B, the embedded metal traces 518(1)-518(3) embedded in the insulating layer 520 of the ETS metallization layer 508 form a metal layer 524 in the insulating layer 520. A height $H_{10}$ (i.e., thickness) of the metal layer 524 controls the maximum height of the embedded metal traces 518(1)-518(3). Thus, the height $H_{10}$ of the metal layer 524 of the ETS metallization layer 508 affects the metal density of the embedded metal traces 518(1)-518(3). In this example, the height $H_{10}$ of the metal layer 524 of the ETS metallization layer 508 is less than the height $H_9$ of the third metal layer 523 of the third, external metallization layer 510. This may allow a tighter (smaller) L/S of formed embedded metal traces 518(1)-518(3) embedded in the insulating layer 520 in the ETS metallization layer 508 to support a higher connection density to the package substrate 502. However, this also causes the metal density of the ETS metallization layer 508 to be less than the metal density of the third, external metallization layer 510. Thus, instead of increasing the height $H_9$ of the third metal layer 523 of the third, external metallization layer 510 to compensate for this metal density imbalance, the supplemental metal layer 504 is provided and disposed on the ETS metallization layer 308 in a vertical direction (Z-axis direction) with the additional metal interconnects 506 of the supplemental metal layer 504 being coupled to respective embedded metal traces 518(1)-518(3). For example, additional metal interconnects 506 of the supplemental metal layer 504 may be directly coupled to respective embedded metal traces 518(1)-518(3) of the ETS metallization layer 508 in the vertical direction (Z-axis direction). The combination of the additional metal interconnects 506 of the supplemental metal layer 504 coupled to respective embedded metal traces 518(1)-518(3) forms die-side metal interconnects 522(1)-522(3) of increased metal density to avoid or reduce the metal density imbalance, and thus CTE imbalance, between the ETS metallization layer 508 and the third, external metallization layer 510 to reduce or avoid warpage of the package substrate 502.

With reference to FIG. 6A, the stacked-die IC package 500 includes the first die 512(1). As shown in FIG. 6B, the first die 512(1) is coupled through die interconnects 526 (e.g., raised interconnect bumps) to the package substrate 502. More specifically, the die interconnects 526 extending from an active side 528 of the first die 512(1) are coupled to other embedded metal traces 530 embedded in the insulating layer 520 of the ETS metallization layer 508. Select die interconnects 526 that designated to provide an external signal interface to the stacked-die IC package 500 can be coupled through the ETS metallization layer 508 to second metal interconnects 516(1), 516(2) in the third, external metallization layer 510 to provide a signal routing path between the first die 512(1) and external interconnects 514. In this example as shown in FIG. 6A, the supplemental metal layer 504 is disposed both inside and outside of the vertical area in the vertical direction (Z-axis direction) between the first die 512(1) and the package substrate 502. The additional metal interconnects 506(1), 506(2) of the supplemental metal layer 504 are disposed outside of the vertical area in the vertical direction (Z-axis direction) between the first die 512(1) and the package substrate 502. This may be because the embedded metal traces 518(1), 318(2) coupled to the additional metal interconnects 506(1), 506(2) are for providing connections that are not directly to the first die 512(1), such as for a ground plane. The additional metal interconnect 506(3) of the supplemental metal layer 504 is disposed inside of the vertical area in the vertical direction (Z-axis direction) between the first die 512(1) and the package substrate 502. This may be because the embedded metal trace 518(3) coupled to the additional metal interconnects 506(3) is for providing a connection to the first die 512(1) through a die interconnect 526.

With reference to FIGS. 6A and 6B, in this example, a solder resist layer 532 is disposed adjacent to a first, outer surface 534 of the insulating layer 520 of the ETS metallization layer 508. The supplemental metal layer 504 is also disposed adjacent to the first, outer surface 534 of the insulating layer 520 of the ETS metallization layer 508. The solder resist layer 532 is disposed over the additional metal interconnects 506(1)-506(3) in the supplemental metal layer 504. Thus, the supplemental metal layer 504 can be thought of as being disposed in the solder resist layer 532. The additional metal interconnects 506(1)-506(3) are not contained in or embedded in the insulating layer 520 of the ETS metallization layer 508 in this example.

As discussed above, the height $H_{10}$ of the metal layer 524 (or its embedded metal traces 518(1)-518(3)) of the ETS metallization layer 508 is less than the height $H_9$ of the third metal layer 523 (or its second metal interconnects 516(1)-516(3)) of the third, external metallization layer 510. The coupling of the additional metal interconnects 506(1)-506(3) to the respective embedded metal traces 518(1)-518(3) avoids or reduces the metal density imbalance between the ETS metallization layer 508 and the third, external metallization layer 510. For example, the height $H_{10}$ of the metal layer 524 of the ETS metallization layer 508 in the vertical direction (Z-axis direction) may be between eight (8) and fourteen (14) μm. As another example, the height $H_9$ of the third metal layer 523 in the third, external metallization layer 510 may be between ten (10) and twenty (20) μm. As another example, as shown in FIG. 5B, a height $H_{11}$ of the supplemental metal layer 504 (or its additional metal interconnects 506(1)-506(3)) in the vertical direction (Z-axis direction) may be between one (1) and five (5) μm. Thus, as an example, a ratio of height $H_{10}$ of the metal layer 524 of the ETS metallization layer 508 to the height $H_{11}$ of the supplemental metal layer 504 may be at least 8/5. And as another example, a ratio of the height $H_{10}$ of the metal layer 524 of the ETS metallization layer 508 to the height $H_9$ of the third metal layer 523 in the third metallization layer 510 may be at least 8/20.

Thus, in these examples, the additional metal interconnects 506(1)-506(3) being coupled to the embedded metal traces 518(1)-518(3) raises the effective height of the embedded metal traces 518(1)-518(3) to the height $H_{10}$ and height $H_{11}$ combined (e.g., 20 μm) to provide effective die-side metal interconnects 522(1)-522(3) of increased metal density. For an example of a 7/9 L/S of the embedded metal traces 518(1)-518(3) in the metal layer 524 of the ETS metallization layer 508, the height $H_{10}$ of the metal layer 524 of the ETS metallization layer 508 may be fourteen (14) μm, the height $H_9$ of the third metal layer 523 in the third, external metallization layer 510 may be fifteen (15) μm, and the height $H_7$ of the supplemental metal layer 504 may be four (4) μm. For an example of a 6/8 L/S of the embedded metal traces 518(1)-518(3) in the metal layer 524 of the ETS metallization layer 508, the height $H_{10}$ of the metal layer 524 of the ETS metallization layer 508 may be twelve (12) μm, the height Ho of the third metal layer 523 in the third, external metallization layer 510 may be fifteen (15) μm, and the height $H_{11}$ of the supplemental metal layer 504 may be four (4) μm.

Using embedded metal trace 518(1) in FIG. 6B as an example, note that as a result of the metal etching of the supplemental metal layer 504 to form the additional metal interconnect 506(1) in the fabrication of the ETS metallization layer 508 in the package substrate 502, outer metal portions 536(1) of the embedded metal trace 518(1) may be recessed below the first, outer surface 534 of the insulating layer 520. An inner metal portion 536(2) of the embedded metal trace 518(1) extends to the same plane as the first, outer surface 534 of the insulating layer 520. This provides a recess 542 in the embedded metal trace 518(1) like discussed above for embedded metal traces 318(1)-318(3) in the ETS metallization layer 508 in FIGS. 3B and 3C. The recess 542 formed in the embedded metal trace 518(1) is a result of using the embedded metal trace 518(1) as an alignment mechanism for etching the supplemental metal layer 504 to leave portions resident to form the additional metal interconnect 506(1). The other embedded metal traces 518(2), 518(3) in the ETS metallization layer 508 also have inner and outer metal portions that form recesses like embedded metal traces 518(1) wherein the additional metal interconnect 506(2), 506(3) are formed by etching the supplemental metal layer 504 in openings formed over the embedded metal traces 518(2), 518(3).

Note that the other details described above regarding the embedded metal traces 318(1)-318(3) in the ETS metallization layer 308 in FIGS. 3A-3C are also applicable to the embedded metal traces 518(1)-518(3) in the ETS metallization layer 508 in FIGS. 6A and 6B.

Figure 7:
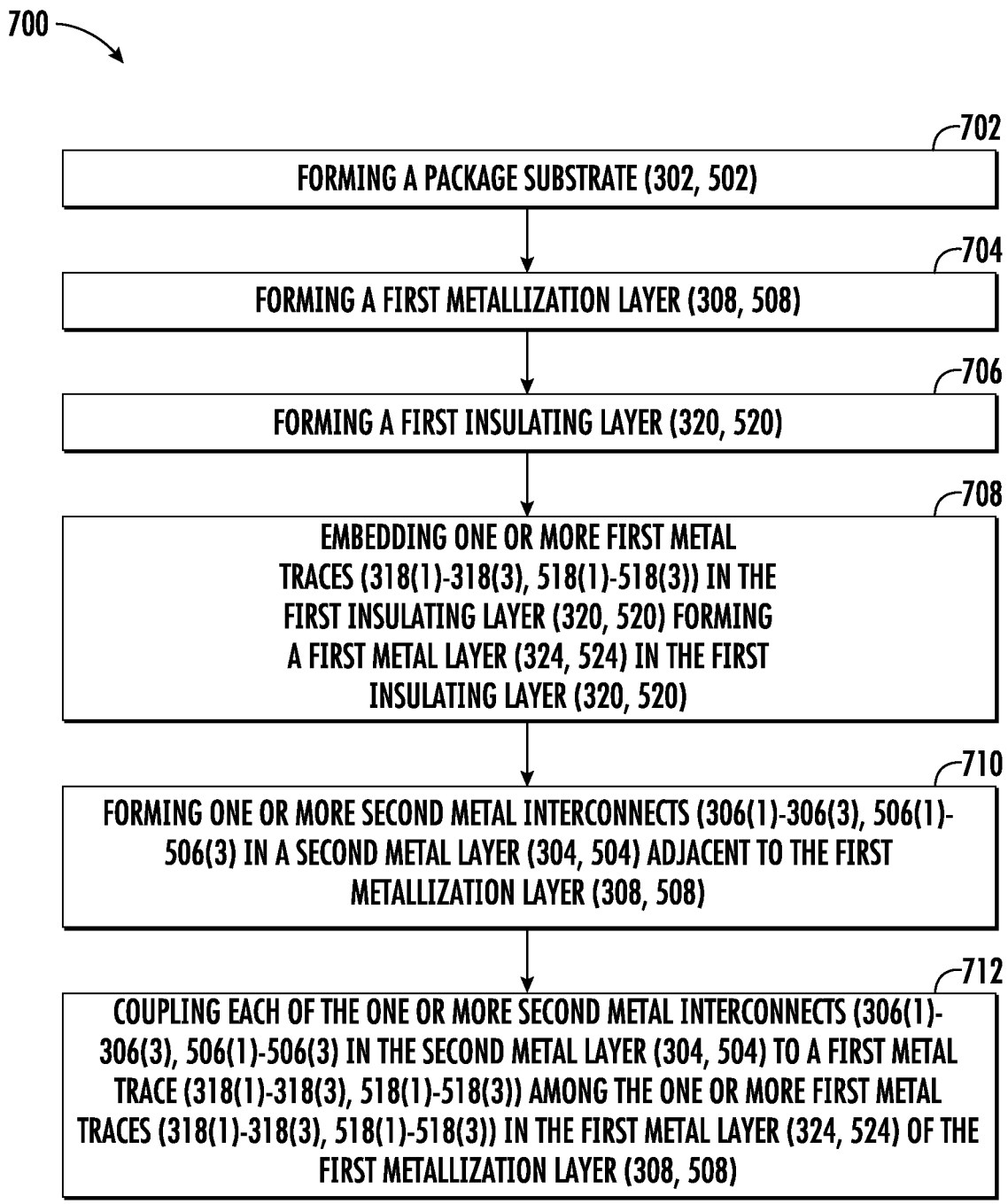
FIG. 7 is a flowchart illustrating an exemplary fabrication process of fabricating an ETS metallization layer with embedded metal traces, and a supplemental metal layer with additional metal interconnects coupled to the embedded metal traces in the ETS metallization layer to increase the metal density of the embedded metal traces, including but not limited to the ETS metallization layer and supplemental metal layer packages in FIGS. 3A-6B.

Fabrication processes can be employed to fabricate package substrates and their ETS metallization layers having embedded metal traces coupled to metal interconnects to reduce impedance of signal paths, including but not limited to the package substrates 302 and 502 in FIGS. 3-6B, respectively. In this regard, FIG. 7 is a flowchart illustrating an exemplary fabrication process 700 of fabricating an ETS metallization layer with a supplemental metal layer that can be included as a die-side ETS metallization structure in a package substrate of an IC package, wherein additional metal interconnects are formed in the supplemental metal layer and coupled to embedded metal traces in the ETS metallization layer to increase the metal density of the embedded metal traces, including but not limited to the package substrates 302, 502 in FIGS. 3A-6B. The fabrication process 700 in FIG. 7 is discussed with regard to the IC packages 300, 500 in FIGS. 3A-3C and 6A-6B.

In this regard, with reference to FIG. 7, a step in the fabrication process 700 includes forming a package substrate 302, 502(block 702 in FIG. 7). Forming the package substrate 302, 502 can include forming a first, ETS metallization layer 308, 508 (block 704 in FIG. 7). The first metallization layer 308, 508 is an ETS metallization layer. Forming the first metallization layer 308, 508 includes forming a first insulating layer 320, 520 of a dielectric material (block 706 in FIG. 7), and then embedding first metal traces 318(1)-318(3), 518(1)-518(3) in the first insulating layer 320, 520 thereby forming a first metal layer 324, 524 in the first insulating layer 320, 520 (block 708 in FIG. 7). A next step in the fabrication process 700 includes forming one or more second, additional metal interconnects 306(1)-306(3), 506(1)-506(3) in a second, supplemental metal layer 304, 504 as the supplemental metal layer 304, 504 adjacent to the first metallization layer 308, 508 (block 710 in FIG. 7). A next step in the fabrication process 700 includes coupling each of the one or more second, additional metal interconnects 306(1)-306(3), 506(1)-506(3) in the second, supplemental metal layer 304, 504 to a first metal trace 318(1)-318(3), 518(1)-518(3) among the one or more first metal traces 318(1)-318(3), 518(1)-518(3) in the first metal layer 324, 524 of the first metallization layer 308, 508 (block 712 in FIG. 7).

Other fabrication processes can also be employed to fabricate an ETS metallization layer with a supplemental metal layer that can be included as a die-side ETS metallization structure in a package substrate of an IC package, wherein additional metal interconnects are formed in the supplemental metal layer and coupled to embedded metal traces in the ETS metallization layer to increase the metal density of the embedded metal traces, including but not limited to the package substrates 302, 502 in FIGS. 3A-6B. In this regard, FIGS. 8A-8E is a flowchart illustrating another exemplary fabrication process 800 of fabricating an ETS metallization layer with a supplemental metal layer that can be included as a die-side ETS metallization structure in a package substrate of an IC package, wherein additional metal interconnects are formed in the supplemental metal layer and coupled to embedded metal traces in the ETS metallization layer to increase the metal density of the embedded metal traces, including but not limited to the package substrates 302, 502 in FIGS. 3A-6B. FIGS. 9A-9I are exemplary fabrication stages 900A-900I during fabrication of an ETS metallization layer with a supplemental metal layer as part of a package substrate according to the fabrication process 800 in FIGS. 8A-8E. The fabrication process 800 as shown in the fabrication stages 900A-900I in FIGS. 9A-9I are in reference to the ETS metallization layer 308 with a supplemental metal layer 304 in the package substrate 302 in FIGS. 3A-3C. However, the fabrication process 800 in FIGS. 8A-8E, and as shown in the fabrication stages 900A-9001 in FIGS. 9A-9I is also applicable to fabricate the ETS metallization layer 508 with a supplemental metal layer 504 in the package substrate 502 in FIGS. 6A-6B.

In this regard, as shown the fabrication stage 900A in FIG. 9A, a first exemplary step in the fabrication process 800 is to prepare to fabricate the ETS metallization layer 308. A first step in forming the ETS metallization layer 308 involves forming raw metal layers 902, 904, 906, 908 on a carrier 910 that will be processed to form the ETS metallization layer 308 and supplemental metal layer (block 802 in FIG. 8A). Metal layers 902, 904, 906, 908 can be copper layers for example. The metal layers 904, 906 are disposed on opposite sides 912(1), 912(2) of the carrier 910. The metal layers 904, 906 can form a seed layer in which the metal layers 902, 908 (e.g., metal foils, such as a copper foils) are formed on. As discussed below, the metal layers 902, 908 will be repurposed through process to form the additional metal interconnects 306(1)-306(3) as part of a supplemental metal layer 304 to increase the metal density of metal traces 318(1)-318(3) embedded in an insulating layer 320. In this example, the metal layer 902 will be used to form the supplemental metal layer 304 for a die-side ETS metallization layer 308.

As shown the fabrication stage 900B in FIG. 9B, a next exemplary step in the fabrication process 800 is to form the metal traces 318(1), 318(3), 330 that will be embedded in the insulating layer 320 of a formed die-side ETS metallization layer 308 in a later processing step (block 804 in FIG. 8A). The metal traces 318(1), 318(3), 330 are formed by disposing another metal layer 324 (e.g., a copper layer) on the metal layer 908 and patterning the metal layer 324 (e.g., using a photoresist layer that is exposed through a mask) to form openings 914 in the metal layer 324 with the remaining metal portions of the metal layer 324 forming the metal traces 318(1), 318(3), 330. As shown the fabrication stage 900C in FIG. 9C, a next exemplary step in the fabrication process 800 is to laminate the formed metal traces 318(1), 318(3), 330 in the metal layer 324 with a dielectric material 916 to form the insulating layer 320 (block 806 in FIG. 8B). This embeds the metal traces 318(1), 318(3), 330 in the insulating layer 320 to form the ETS metallization layer 308.

As shown the fabrication stage 900D in FIG. 9D, a next exemplary step in the fabrication process 800 is to remove the carrier 910 and metal layer 906 to prepare the metal layer 908 to be etched to expose the embedded metal traces 318(1), 318(3), 330 of the ETS metallization layer 308 to be able to make interconnections (block 808 in FIG. 8B). The metal layer 906 would normally be fully etched away as part of the fabrication process for fabricating the ETS metallization layer 308. However, in this fabrication process 800, the metal layer 906 will be repurposed by only being selectively etched to form the additional metal interconnects 306(1)-306(3) to increase the metal density of the ETS metallization layer 308. Thus, the metal layer 906 will form the supplemental metal layer 304. Because the embedded metal traces 318(1)-318(3) were already formed in contact with the metal layer 906, when the metal layer 906 is selectively etched, the remaining metal material of the metal layer 906 that is unetched and that forms the additional metal interconnects 306(1)-306(3) will already be coupled to the embedded metal traces 318(1)-318(3).

Figure 9E:
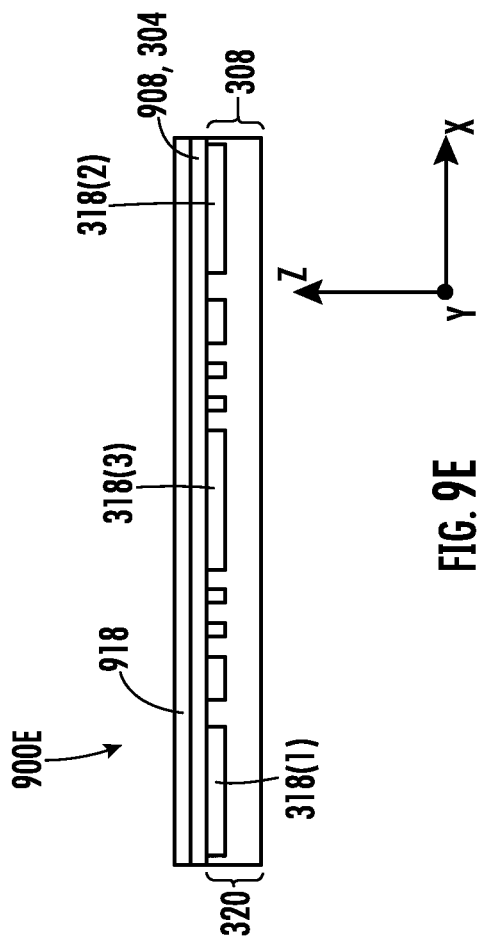
Figure 9F:
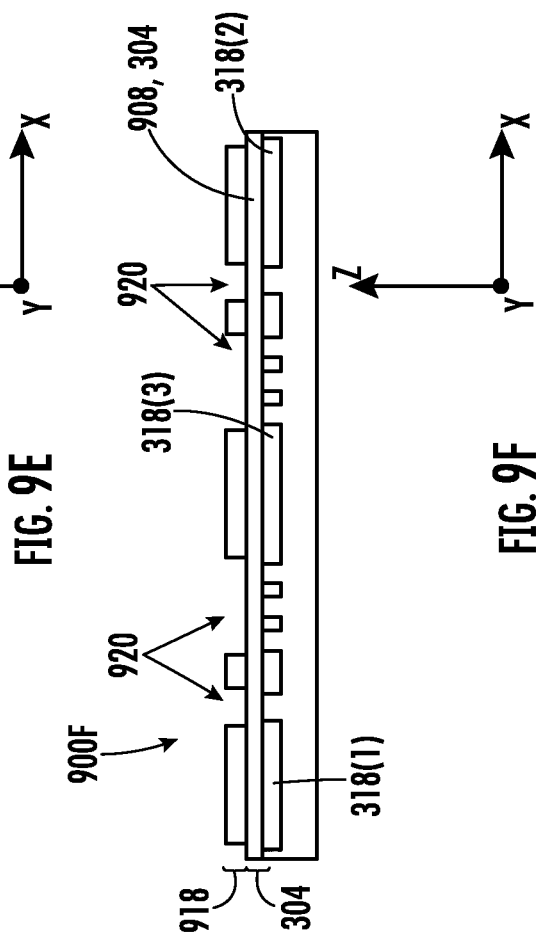
Figure 8C:
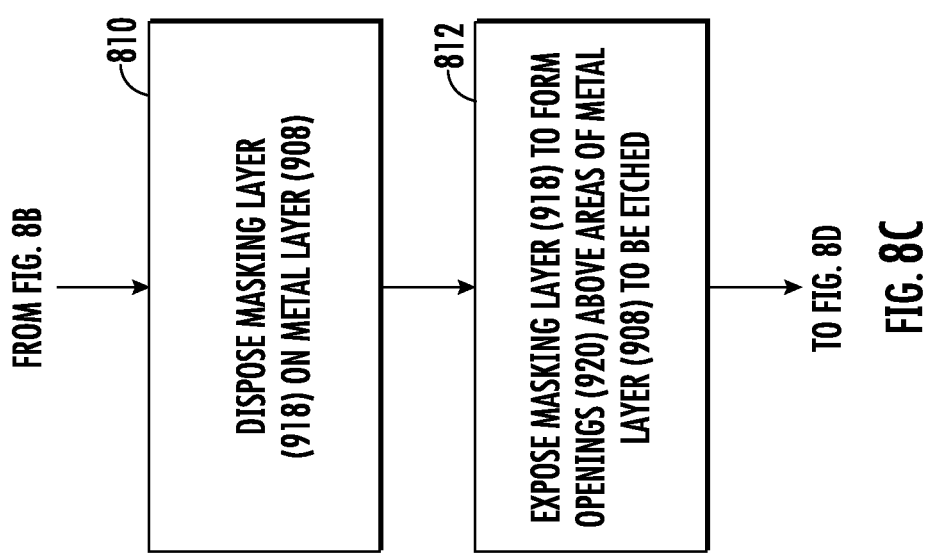

As shown the fabrication stage 900E in FIG. 9E, a next exemplary step in the fabrication process 800 is to dispose (i.e., laminate) a masking layer 918 of a masking material on the metal layer 908 to prepare the metal layer 908 to be selectively etched to form the additional metal interconnects 306(1)-306(3) in the supplemental metal layer 304(block 810 in FIG. 8C). For example, the masking layer 918 can be made of a material that is resistant to metal etching processes, such as a chemical or mechanical etching process. Then, as shown the fabrication stage 900F in FIG. 9F, a next exemplary step in the fabrication process 800 is to expose the masking layer 918 through a mask to form the openings 920 in the masking layer 918 (block 812 in FIG. 8D). The openings 920 are formed above areas in the metal layer 908 that will be etched away in a subsequent etching process, with the remaining metal portions of the metal layer 908 protected by the masking layer 918 forming the additional metal interconnects 306(1)-306(3) in the metal layer 908 as the supplemental metal layer 304.

Figure 9G:
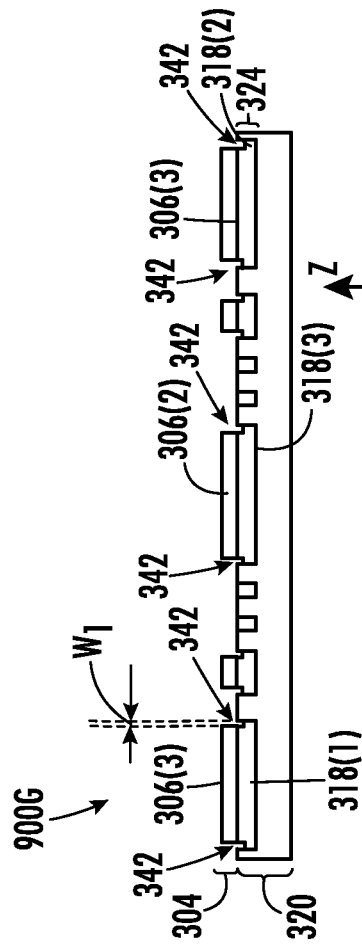
Figure 9H:
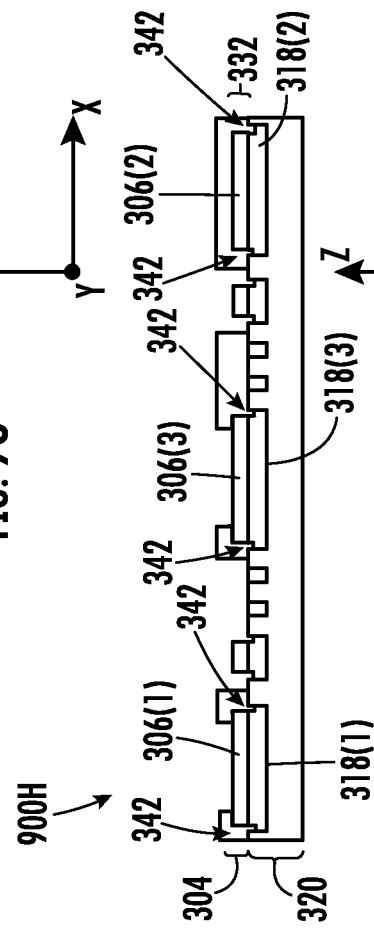
Figure 8D:
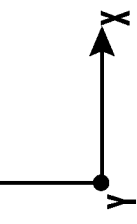
Figure 9I:
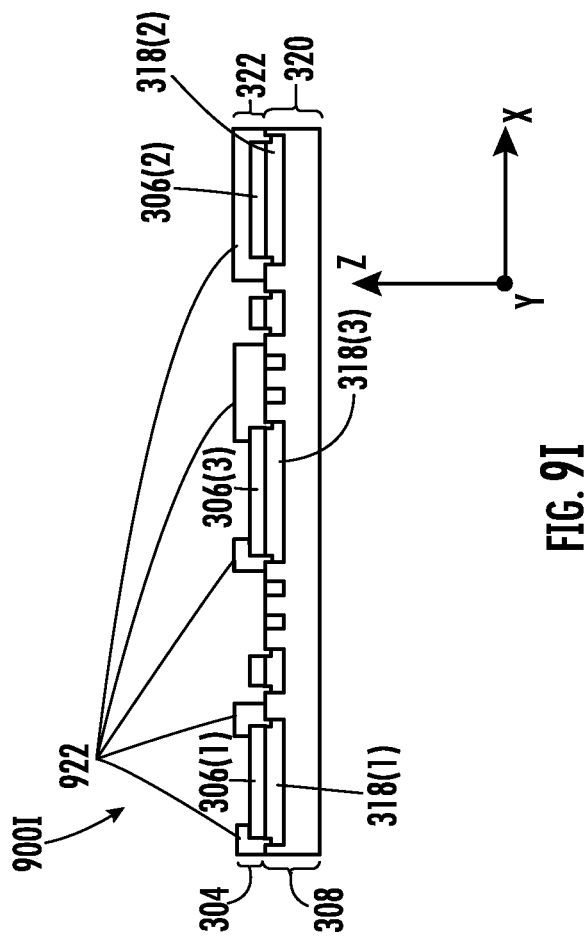

As shown the fabrication stage 900G in FIG. 9G, a next exemplary step in the fabrication process 800 is to etch inside the openings 920 formed in the masking layer 918 to etch the metal material away in the metal layer 908 exposed by the openings 920 (block 814 in FIG. 8D). The masking layer 918 not removed above areas of the metal layer 908 protect those areas from being etched away such that the metal layer 908 is repurposed. The areas of the metal layer 908 that are protected by the masking layer 918 are not etched away from the additional metal interconnects 306 (1)-306(3) of the supplemental metal layer 304. Note that the openings 920 were formed in the process step as shown in fabrication stage 900F in FIG. 9F that leaves the additional metal interconnects 306(1)-306(3) short by width Wi of extending fully above the embedded metal traces 318(1)-318(3) as previously discussed. This forms the recesses 342 in the embedded metal traces 318(1)-318(3) as shown in fabrication stage 900G in FIG. 9G. As shown the fabrication in stage 900H in FIG. 9H, a next exemplary step in the fabrication process 800 is to form the solder resist layer 332 above the additional metal interconnects 306(1)-306(3) in the supplemental metal layer 304 and inside the recesses 342(block 816 in FIG. 8D). As shown the fabrication in stage 900I in FIG. 9I, a next exemplary step in the fabrication process 800 is to finish (e.g., polish) the upper surface 922 of the solder resist layer 332(block 818 in FIG. 8E).

Figure 8E:
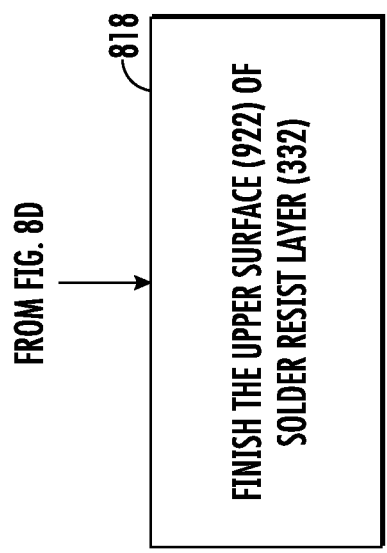

IC packages that employ a supplemental metal layer with additional metal interconnects coupled to embedded metal traces in a die-side ETS metallization layer of a package substrate to avoid or reduce metal density mismatch between the die-side ETS metallization layer and another metallization layer(s) in the package substrate, including, but not limited, to the package substrates in FIGS. 3A-6B, and 9A-9I and according to the exemplary fabrication processes in FIGS. 7-8E, and according to the exemplary fabrication processes in FIGS. 8-9C, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 10:
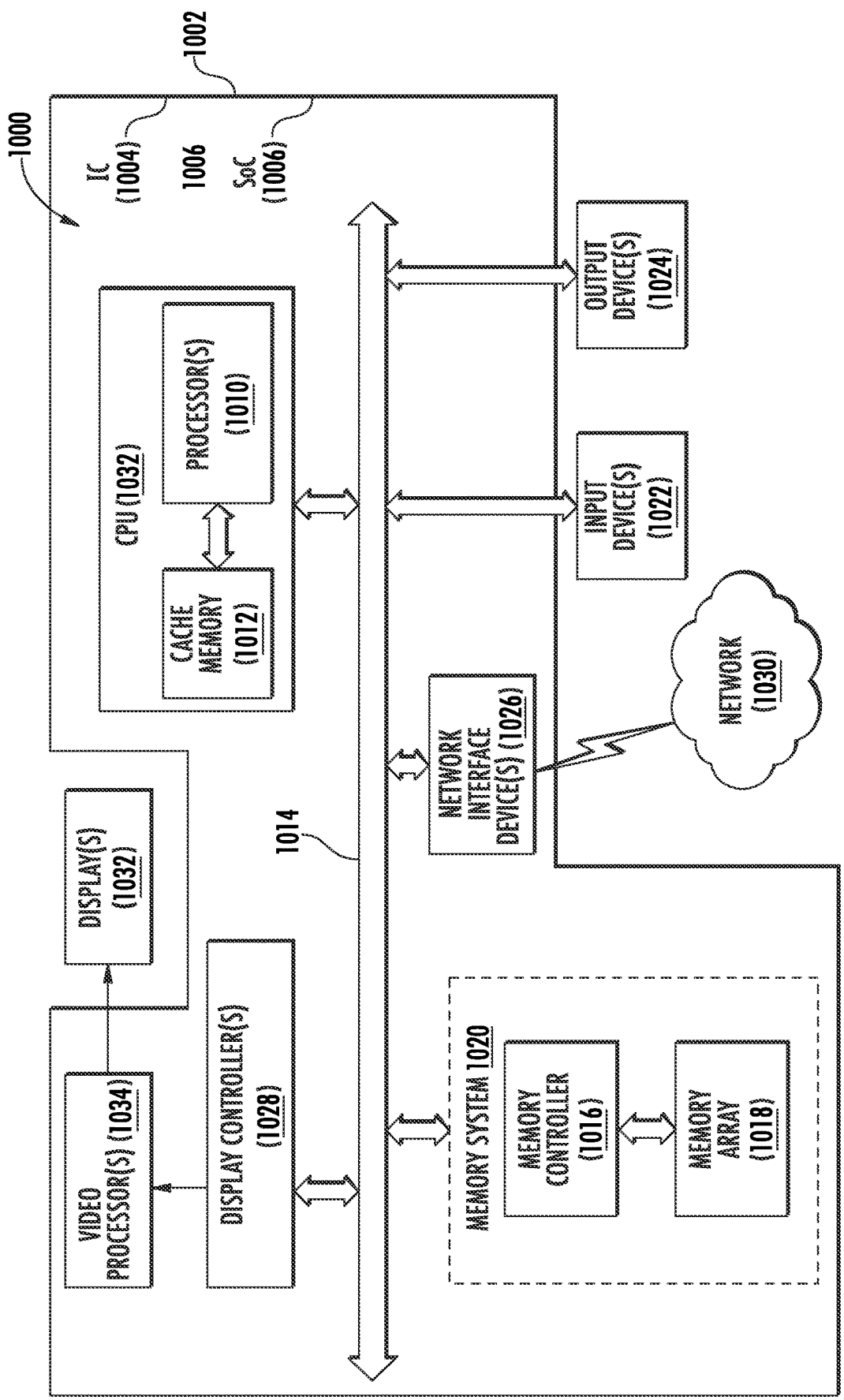
FIG. 10 is a block diagram of an exemplary processor-based system that can include components that can include an IC package that employs a supplemental metal layer with additional metal interconnects coupled to embedded metal traces in a die-side ETS metallization layer of a package substrate to avoid or reduce metal density mismatch between the die-side ETS metallization layer and another metallization layer(s) in the package substrate, including, but not limited, to the package substrates in FIGS. 3A-6B, and 9A-9I, and according to the exemplary fabrication processes in FIGS. 7-8E.

In this regard, FIG. 10 illustrates an example of a processor-based system 1000 including a circuit that can be provided in an IC package 1002 that includes a die(s). The IC package 1002 employs a supplemental metal layer with additional metal interconnects coupled to embedded metal traces in a die-side ETS metallization layer of a package substrate to avoid or reduce metal density mismatch between the die-side ETS metallization layer and another metallization layer(s) in the package substrate, including, but not limited, to the package substrates in FIGS. 3A-6B, and 9A-9I and according to the exemplary fabrication processes in FIGS. 7-8E, and according to any aspects disclosed herein. In this example, the processor-based system 1000 may be formed as an IC 1004 in an IC package 1002 and as a system-on-a-chip (SoC) 1006. The processor-based system 1000 includes a central processing unit (CPU) 1008 that includes one or more processors 1010, which may also be referred to as CPU cores or processor cores. The CPU 1008 may have cache memory 1012 coupled to the CPU 1008 for rapid access to temporarily stored data. The CPU 1008 is coupled to a system bus 1014 and can intercouple master and slave devices included in the processor-based system 1000. As is well known, the CPU 1008 communicates with these other devices by exchanging address, control, and data information over the system bus 1014. For example, the CPU 1008 can communicate bus transaction requests to a memory controller 1016, as an example of a slave device.

Although not illustrated in FIG. 10, multiple system buses 1014 could be provided, wherein each system bus 1014 constitutes a different fabric.

Other master and slave devices can be connected to the system bus 1014. As illustrated in FIG. 10, these devices can include a memory system 1020 that includes the memory controller 1016 and a memory array(s) 1018, one or more input devices 1022, one or more output devices 1024, one or more network interface devices 1026, and one or more display controllers 1028, as examples. Each of the memory system(s) 1020, the one or more input devices 1022, the one or more output devices 1024, the one or more network interface devices 1026, and the one or more display controllers 1028 can be provided in the same or different IC packages 1002. The input device(s) 1022 can include any type of input device, including, but not limited to, input keys, switches, voice processors, etc. The output device(s) 1024 can include any type of output device, including, but not limited to, audio, video, other visual indicators, etc. The network interface device(s) 1026 can be any device configured to allow exchange of data to and from a network 1030. The network 1030 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1026 can be configured to support any type of communications protocol desired.

The CPU 1008 may also be configured to access the display controller(s) 1028 over the system bus 1014 to control information sent to one or more displays 1032. The display controller(s) 1028 sends information to the display(s) 1032 to be displayed via one or more video processors 1034, which process the information to be displayed into a format suitable for the display(s) 1032. The display controller(s) 1028 and video processor(s) 1034 can be included as ICs in the same or different IC packages 1002, and in the same or different IC package 1002 containing the CPU 1008, as an example. The display(s) 1032 can include any type of display, including, but not limited to, a cathode ray tube (CRT), a liquid crystal display (LCD), a plasma display, a light emitting diode (LED) display, etc.

Figure 11:
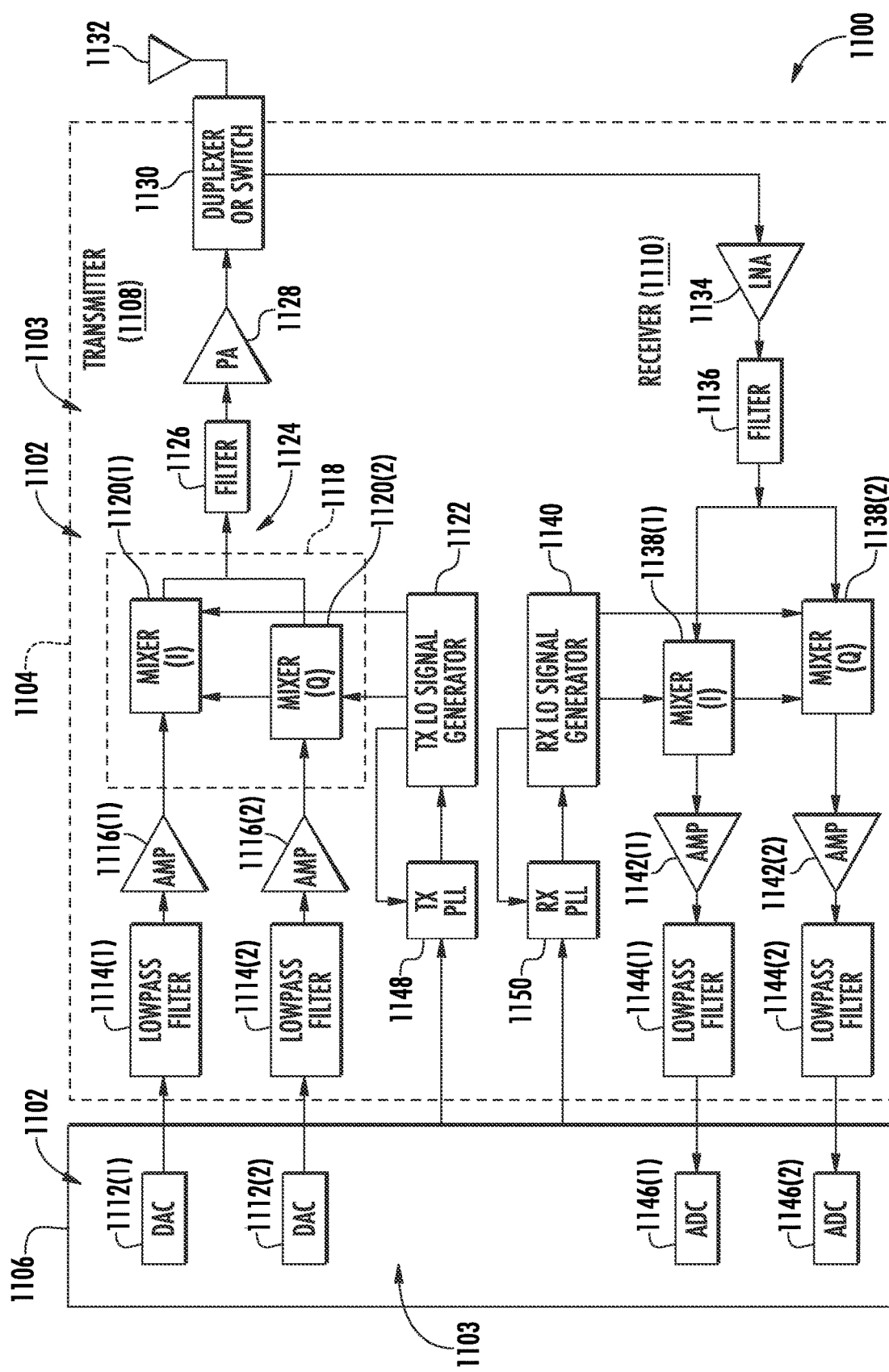
FIG. 11 is a block diagram of an exemplary wireless communications device that includes radio-frequency (RF) components that can include an IC package that employs a supplemental metal layer with additional metal interconnects coupled to embedded metal traces in a die-side ETS metallization layer of a package substrate to avoid or reduce metal density mismatch between the die-side ETS metallization layer and another metallization layer(s) in the package substrate, including, but not limited to the package substrates in FIGS. 3A-6B, and 9A-9I, and according to the exemplary fabrication processes in FIGS. 7-8E.

FIG. 11 illustrates an exemplary wireless communications device 1100 that includes radio frequency (RF) components formed from one or more ICs 1102, wherein any of the ICs 1102 can be included in an IC package 1103 that includes a die(s). The IC package 1103 employs a supplemental metal layer with additional metal interconnects coupled to embedded metal traces in a die-side ETS metallization layer of a package substrate to avoid or reduce metal density mismatch between the die-side ETS metallization layer and another metallization layer(s) in the package substrate, including, but not limited, to the package substrates in FIGS. 3A-6B, and 9A-9I and according to the exemplary fabrication processes in FIGS. 7-8E, and according to any aspects disclosed herein. The wireless communications device 1100 may include or be provided in any of the above-referenced devices, as examples. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RF ICs (RFICs), mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1110. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1), 1112(2) for converting digital signals generated by the data processor 1106 into the I and Q analog output signals, e.g., I and Q output currents, for further processing.

Within the transmitter 1108, lowpass filters 1114(1), 1114(2) filter the I and Q analog output signals, respectively, to remove undesired signals caused by the prior digital-to-analog conversion. Amplifiers (AMPs) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals through mixers 1120(1), 1120(2) from a TX LO signal generator 1122 to provide an upconverted signal 1124. A filter 1126 filters the upconverted signal 1124 to remove undesired signals caused by the frequency up-conversion as well as noise in a receive frequency band. A power amplifier (PA) 1128 amplifies the upconverted signal 1124 from the filter 1126 to obtain the desired output power level and provides a transmit RF signal. The transmit RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Down-conversion mixers 1138(1), 1138(2) mix the output of the filter 1136 with I and Q RX LO signals (i.e., LO_I and LO_Q) from an RX LO signal generator 1140 to generate I and Q baseband signals. The I and Q baseband signals are amplified by AMPs 1142(1), 1142(2) and further filtered by lowpass filters 1144(1), 1144(2) to obtain I and Q analog input signals, which are provided to the data processor 1106. In this example, the data processor 1106 includes analog-to-digital converters (ADCs) 1146(1), 1146(2) for converting the analog input signals into digital signals to be further processed by the data processor 1106.

In the wireless communications device 1100 of FIG. 11, the TX LO signal generator 1122 generates the I and Q TX LO signals used for frequency up-conversion, while the RX LO signal generator 1140 generates the I and Q RX LO signals used for frequency down-conversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered aspects/clauses:

1. An integrated circuit (IC) package, comprising:
   a package substrate, comprising:
   a first metallization layer comprising:
   a first insulating layer; and
   a first metal layer comprising one or more first metal traces embedded in the first insulating layer; and
   a second metal layer disposed adjacent to the first metallization layer, the second metal layer comprising one or more second metal interconnects each coupled to a first metal trace among the one or more first metal traces in the first metal layer of the first metallization layer.

2. The IC package of clause 1, wherein:
   the second metal layer is disposed adjacent to a first side of the first metallization layer in a vertical direction; and
   the package substrate further comprises:
   one or more vertical interconnect accesses (vias) each coupled to a first metal trace among the one or more first metal traces on a second side of the first metallization layer in the vertical direction.

3. The IC package of clause 2, wherein the package substrate further comprises a third metallization layer comprising a third metal layer comprising one or more third metal interconnects;
   each via among the one or more vias coupled to a third metal interconnect among the one or more third metal interconnects.

4. The IC package of clause 3, further comprising one or more external interconnects each coupled to a third metal interconnect among the one or more third metal interconnects in the third metallization layer.

5 The IC package of any of clauses 3-4, wherein:
   the one or more first metal traces each have a first height in a vertical direction between twelve (12) and fourteen (14) micrometers (µm) in a vertical direction; and
   the one or more third metal interconnects each have a second height in the vertical direction between ten (10) µm and twenty (20) µm.

6 The IC package of any of clauses 3-5, wherein:
   the one or more first metal traces have a first height in a vertical direction;

the one or more third metal interconnects have a second height in the vertical direction; and
a ratio of the first height to the second height is at least 8/20.

7. The IC package of clause 1, wherein the one or more second metal interconnects are each in direct contact with a first metal trace among the one or more first metal traces.

8 The IC package of any of clauses 1-7, further comprising a solder resist layer adjacent to the first metallization layer, wherein the second metal layer is disposed in the solder resist layer.

9. The IC package of any of clauses 1-8, wherein:
the first insulating layer comprises a first surface; and
the second metal layer is disposed adjacent to the first surface.

10. The IC package of clause 9, wherein:
the first surface of the first insulating layer is disposed in a horizontal plane in a horizontal direction; and
at least a portion of the one or more first metal traces each comprise a second surface extending to the horizontal plane in a vertical direction.

11. The IC package of any of clauses 1-10, wherein the one or more second metal interconnects are not embedded in the first insulating layer.

12. The IC package of any of clauses 1-11, wherein the one or more first metal traces each comprise:
an outer metal portion having a first height in a vertical direction; and
an inner metal portion disposed inside the outer metal portion, the inner metal portion having a second height in the vertical direction less than the first height.

13. The IC package of clause 12, wherein:
the first insulating layer comprises a first surface adjacent to the second metal layer, the first surface disposed in a first horizontal plane in a horizontal direction; and
for each of the one or more first metal traces:
the outer metal portion comprises:
a second surface disposed a second horizontal plane in the horizontal direction; and
a third surface opposite to the second surface in the vertical direction and adjacent to the second metal layer, the third surface disposed in a third horizontal plane in the horizontal direction between the first horizontal plane and the second horizontal plane in the vertical direction; and
the inner metal portion comprises:
a fourth surface disposed in the second horizontal plane; and
a fifth surface opposite to the fourth surface in the vertical direction and adjacent to the second metal layer, the fifth surface disposed in the first horizontal plane.

14. The IC package of any of clauses 1-13, wherein:
the one or more first metal traces have a first height in a vertical direction between eight (8) and fourteen (14) micrometers (μm); and
one or more second metal interconnects have a second height in the vertical direction between one (1) and five (5) μm.

15. The IC package of any of clauses 1-14, wherein:
the one or more first metal traces each have a first height in a vertical direction;
the one or more second metal interconnects each have a second height in the vertical direction; and
a ratio of the first height to the second height is at least 8/5.

16. The IC package of any of clauses 1-15, wherein the one or more first metal traces each have a first width in a horizontal direction less than or equal to seven (7) micrometers (μm); and
further comprising one or more spaces between adjacent first metal traces among the one or more first metal traces having a second width in the horizontal direction less than or equal to nine (9) μm.

17. The IC package of any of clauses 1-16, further comprising a die coupled to the package substrate.

18. The IC package of clause 17, wherein the die comprises one or more die interconnects each coupled to a first metal trace among the one or more first metal traces.

19. The IC package of any of clauses 17-18, wherein the one or more die interconnects are each coupled to a second metal interconnect among the one or more second metal interconnects in the second metal layer.

20. The IC package of any of clauses 17-19, wherein at least a portion of the second metal layer is disposed between the die and the first metallization layer in a vertical direction.

21. The IC package of any of clauses 17-20, wherein the second metal layer is disposed outside of the die in a vertical direction.

22. The IC package of any of clauses 1-21 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

23 A method of fabricating an integrated circuit (IC) package, comprising:
forming a package substrate, comprising:
forming a first metallization layer, comprising:
forming a first insulating layer; and
embedding one or more first metal traces in the first insulating layer forming a first metal layer in the first insulating layer;
forming one or more second metal interconnects in a second metal layer adjacent to the first metallization layer; and
coupling each of the one or more second metal interconnects in the second metal layer to a first metal trace among the one or more first metal traces in the first metal layer of the first metallization layer.

24. The method of clause 23, wherein:
forming the one or more second metal interconnects in the second metal layer comprises forming the one or more second metal interconnects in the second metal layer adjacent to a first side of the first metallization layer in a vertical direction; and
forming the package substrate further comprises:
forming one or more vertical interconnect accesses (vias) each coupled to a first metal trace among the one or more first metal traces on a second side of the first metallization layer in the vertical direction.

25. The method of clause 24, wherein forming the package substrate further comprises forming a third metallization layer comprising a third metal layer comprising one or more third metal interconnects; and
  further comprising coupling each of the one or more third metal interconnects in the third metal layer to a via among the one or more vias.

26. The method of clause 23, wherein coupling each of the one or more second metal interconnects comprises disposing each of the one or more second metal interconnects in the second metal layer in contact with first metal trace among the one or more first metal traces in the first metal layer of the first metallization layer.

27. The method of any of clauses 23-26, further comprising forming a solder resist layer over the second metal layer and adjacent to the first metallization layer such that the second metal layer is disposed in the solder resist layer.

28 The method of any of clauses 23-27, wherein:
  forming the first insulating layer further comprises forming a first surface disposed in a horizontal plane in a horizontal direction; and
  embedding the one or more first metal traces in the first insulating layer further comprises forming a second surface in at least a portion of the one or more first metal traces extending to the horizontal plane in a vertical direction.

29. The method of any of clauses 23-28, further comprising not embedding the one or more second metal interconnects in the first insulating layer.

30. The method of any of clauses 23-29, further comprising coupling a die coupled to the package substrate.

31. The method of clause 30, wherein coupling the die comprises coupling at least one die interconnect of the die to a second metal interconnects among the one or more second metal interconnects in the second metal layer.

32. The method of any of clauses 23-31, further comprising:
  providing a carrier;
  forming a second metal layer on the carrier; and
  forming the one or more first metal traces in the first metal layer disposed on the second metal layer.

33. The method of clause 32, wherein embedding one or more first metal traces in the first insulating layer comprises:
  forming the one or more first metal traces in the first metal layer; and
  laminating the one or more first metal traces in the first metal layer with a dielectric material forming the first insulating layer.

34. The method of clause 33, further comprising:
  disposing a masking layer on the second metal layer;
  exposing the masking layer to form one or more openings in the masking layer above the second metal layer; and
  etching inside the one or more openings into the second metal layer exposed from the one or more openings to form the one or more second metal interconnects in the second metal layer not etched.

35. The method of clause 34, further comprising forming a solder resist layer on the second metal layer.

What is claimed is:
1. An integrated circuit (IC) package, comprising:
  a package substrate that extends in a first direction, comprising:
    a first metallization layer comprising:
      a first insulating layer comprising an outer surface; and
      a first metal layer comprising one or more first metal traces embedded in the first insulating layer, wherein the one or more first metal traces each comprise:
        an outer metal portion having a first height in a second direction orthogonal to the first direction; and
        an inner metal portion disposed inside the outer metal portion, the inner metal portion having a second height in the second direction less than the first height;
    a die comprising one or more die interconnects each coupled to the first metallization layer in a vertical area between the die and the outer surface of the first metallization layer; and
    a second metal layer laterally adjacent to the vertical area and vertically adjacent to the outer surface of the first insulating layer, the second metal layer comprising one or more second metal interconnects each coupled to a first metal trace among the one or more first metal traces in the first metal layer of the first metallization layer.

2. The IC package of claim 1, wherein:
  each of the one or more first metal traces comprise a second surface adjacent to the second metal layer and a third surface opposite the second surface; and
  the package substrate further comprises:
    one or more vias each coupled to a third surface of a first metal trace among the one or more first metal traces.

3. The IC package of claim 2, wherein the package substrate further comprises a third metallization layer comprising a third metal layer comprising one or more third metal interconnects;
  each via among the one or more vias coupled to a third metal interconnect among the one or more third metal interconnects.

4. The IC package of claim 3, further comprising one or more external interconnects each coupled to a third metal interconnect among the one or more third metal interconnects in the third metallization layer.

5. The IC package of claim 3, wherein:
  wherein the first height of the one or more first metal traces is between twelve (12) and fourteen (14) micrometers (μm) in the second direction; and
  the one or more third metal interconnects each have a second height in the second direction between ten (10) μm and twenty (20) μm.

6. The IC package of claim 3, wherein:
  the one or more third metal interconnects have a second height in the second direction; and
  a ratio of the first height to the second height is at least 8/20.

7. The IC package of claim 1, wherein the one or more second metal interconnects are each in contact with the first metal trace among the one or more first metal traces.

8. The IC package of claim 1, wherein:
  the first insulating layer comprises the outer surface adjacent to the second metal layer, the outer surface disposed in a first horizontal plane in the first direction; and
  for each of the one or more first metal traces:
    the outer metal portion comprises:
      a second surface disposed in a second horizontal plane in the first direction; and
      a third surface opposite the second surface in the second direction and adjacent to the second metal layer, the third surface disposed in a third horizontal plane in the first direction between the first horizontal plane and the second horizontal plane in the second direction; and the inner metal portion comprises:
a fourth surface disposed in the second horizontal plane; and
a fifth surface opposite the fourth surface in the second direction and adjacent to the second metal layer, the fifth surface disposed in the first horizontal plane.

9. The IC package of claim 1, wherein:
wherein the first height of the one or more first metal traces are between eight (8) and fourteen (14) micrometers (μm); and
the second height of the one or more second metal interconnects are between one (1) and five (5) μm.

10. The IC package of claim 1, wherein:
a ratio of the first height to the second height is at least 8/5.

11. The IC package of claim 1, wherein:
the one or more first metal traces each have a first width in the first direction less than or equal to seven (7) micrometers (μm); and
further comprising one or more spaces between adjacent first metal traces among the one or more first metal traces having a second width in the first direction less than or equal to nine (9) μm.

12. The IC package of claim 1, wherein:
the second metal layer is disposed outside of the die in a second direction orthogonal to the first direction.

13. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

14. The IC package of claim 1, wherein:
the outer surface of the first insulating layer extends in a first plane;
each of the one or more second metal interconnects has a second surface adjacent to a coupled first metal trace of the one or more first metal traces and a third surface opposite the second surface in a second direction orthogonal to the first direction; and
each third surface of the one or more second metal interconnects extends in a second plane parallel to the first plane.

15. The IC package of claim 1, further comprising a mold disposed between the one or more second metal interconnects and the one or more die interconnects.

16. The IC package of claim 15, wherein the mold is disposed adjacent to the die.

17. The IC package of claim 15, wherein:
each of the one or more second metal interconnects has a second surface adjacent to a coupled first metal trace of the one or more first metal traces and a third surface opposite the second surface; and
the mold is adjacent to each third surface of the one or more second metal interconnects.

18. The IC package of claim 1, wherein:
the first metal layer further comprises one or more third metal traces embedded in the first insulating layer; and
at least one first die interconnect of the one or more die interconnects is coupled to a third metal trace of the one or more third metal traces.

19. The IC package of claim 1, wherein at least one second die interconnect of the one or more die interconnects is coupled to a second metal interconnect of the one or more second metal interconnects.

20. The IC package of claim 1, wherein:
the one or more first metal traces each comprise a second surface planar to the outer surface of the first insulating layer; and
each second metal interconnect of the one or more second metal interconnects is coupled to the second surface of a first metal trace of the one or more first metal traces.

21. The IC package of claim 1, further comprising one or more second insulating layers each laterally adjacent to the vertical area and vertically adjacent to a second metal interconnect of the one or more second metal interconnects.

22. The IC package of claim 21, wherein each of the one or more second insulating layers is coupled to only a portion of the outer surface of the first metallization layer.

23. The IC package of claim 21, wherein the one or more second insulating layers comprise one or more solder resist layers.

24. A method of fabricating an integrated circuit (IC) package, comprising:
forming a package substrate that extends in a first direction, comprising:
forming a first metallization layer, comprising:
forming a first insulating layer comprising an outer surface; and
embedding one or more first metal traces in the first insulating layer forming a first metal layer in the first insulating layer, wherein the one or more first metal traces each comprise;
an outer metal portion having a first height in a second direction orthogonal to the first direction; and
an inner metal portion disposed inside the outer metal portion, the inner metal portion having a second height in the second direction less than the first height;
coupling one or more die interconnects of a die to the first metallization layer in a vertical area between the die and the outer surface of the first metallization layer;
forming one or more second metal interconnects in a second metal layer laterally adjacent to the vertical area and vertically adjacent to the outer surface of the first insulating layer; and
coupling each of the one or more second metal interconnects in the second metal layer to a first metal trace among the one or more first metal traces in the first metal layer of the first metallization layer.

25. The method of claim 24, wherein:
the one or more first metal traces each comprise a second surface adjacent to the second metal layer and a third surface opposite the second surface; and
forming the package substrate further comprises:
forming one or more vias each coupled to a third surface of a first metal trace among the one or more first metal traces.

26. The method of claim 25, wherein forming the package substrate further comprises forming a third metallization layer comprising a third metal layer comprising one or more third metal interconnects; and further comprising coupling each of the one or more third metal interconnects in the third metal layer to a via among the one or more vias.

27. The method of claim 24, wherein coupling each of the one or more second metal interconnects comprises disposing each of the one or more second metal interconnects in the second metal layer in contact with the first metal trace among the one or more first metal traces in the first metal layer of the first metallization layer.

28. The method of claim 24, further comprising forming a solder resist layer over the second metal layer and adjacent to the first metallization layer such that the second metal layer is disposed in the solder resist layer.

29. The method of claim 24, wherein:
the one or more first metal traces each comprise a second surface adjacent to the second metal layer and a third surface opposite the second surface;
forming the first insulating layer further comprises forming the outer surface in a first plane; and
embedding the one or more first metal traces in the first insulating layer further comprises disposing the second surface of the one or more first metal traces planar to the first plane.

30. The method of claim 24, further comprising not embedding the one or more second metal interconnects in the first insulating layer.

31. The method of claim 24, further comprising:
providing a carrier;
forming the second metal layer on the carrier; and
forming the one or more first metal traces in the first metal layer disposed on the second metal layer.

32. The method of claim 31, wherein embedding the one or more first metal traces in the first insulating layer comprises:
forming the one or more first metal traces in the first metal layer; and
laminating the one or more first metal traces in the first metal layer with a dielectric material forming the first insulating layer.

33. The method of claim 32, further comprising:
disposing a masking layer on the second metal layer;
exposing the masking layer to form one or more openings in the masking layer above the second metal layer; and
etching inside the one or more openings into the second metal layer exposed from the one or more openings to form the one or more second metal interconnects in the second metal layer not etched.

34. The method of claim 24, wherein:
forming the first insulating layer comprises forming the first insulating layer comprising the outer surface extending in a first plane; and
forming the one or more second metal interconnects further comprises forming a second surface of each of the one or more second metal interconnects adjacent to a coupled first metal trace of the one or more first metal traces and a third surface of each of the one or more second metal interconnects opposite the second surface, the third surface of each of the one or more second metal interconnects extending in a second plane parallel to the first plane.

35. The method of claim 24, further comprising forming a mold between the one or more second metal interconnects and the one or more die interconnects.

36. The method of claim 24, wherein:
forming the first metal layer further comprises embedding one or more third metal traces in the first insulating layer; and
coupling the one or more die interconnects further comprises coupling at least one first die interconnect of the one or more die interconnects to a third metal trace of the one or more third metal traces.

37. The method of claim 24, wherein coupling the one or more die interconnects further comprises coupling at least one second die interconnect of the one or more die interconnects to a second metal interconnect of the one or more second metal interconnects.

* * * * *